(12) United States Patent
Loghin et al.

(10) Patent No.: US 9,887,807 B2
(45) Date of Patent: Feb. 6, 2018

(54) TRANSMITTER AND METHOD OF TRANSMITTING AND RECEIVER AND METHOD OF RECEIVING

(71) Applicant: Sony Corporation, Tokyo (JP)

(72) Inventors: Nabil Sven Loghin, Stuttgart (DE); Ryoji Ikegaya, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/348,542

(22) Filed: Nov. 10, 2016

(65) Prior Publication Data

US 2017/0063494 A1 Mar. 2, 2017

Related U.S. Application Data

(63) Continuation of application No. 14/969,418, filed on Dec. 15, 2015, now Pat. No. 9,520,966.

(30) Foreign Application Priority Data

Dec. 15, 2014 (GB) .................................. 1422307.7
Mar. 12, 2015 (GB) .................................. 1504207.0

(51) Int. Cl.
*H04L 1/00* (2006.01)
*H04L 5/00* (2006.01)
(Continued)

(52) U.S. Cl.
CPC .......... *H04L 1/0071* (2013.01); *H04L 1/0041* (2013.01); *H04L 1/0042* (2013.01);
(Continued)

(58) Field of Classification Search
USPC ................... 375/260, 267, 240.27
See application file for complete search history.

(56) References Cited

U.S. PATENT DOCUMENTS

2011/0096854 A1* 4/2011 Fanson ................... H04L 27/12 375/260
2012/0269277 A1* 10/2012 Markman ............. H04L 1/0057 375/240.27

(Continued)

FOREIGN PATENT DOCUMENTS

CN 103595499 A 2/2014
CN 103684666 3/2014

(Continued)

OTHER PUBLICATIONS

International Search Report and Written Opinion dated Mar. 11, 2016, in PCT/EP2015/079656, filed Dec. 14, 2015.

(Continued)

*Primary Examiner* — Eva Puente
(74) *Attorney, Agent, or Firm* — Oblon, McClelland, Maier & Neustadt, L.L.P.

(57) ABSTRACT

A transmitter transmits data using Orthogonal Frequency Division, OFDM, symbols. The transmitter comprising a forward error correction encoder configured to encode the data to form forward error correction encoded frames of encoded data cells, a service frame builder configured to form a service frame for transmission comprising a plurality of forward error correction encoded frames, a convolutional interleaver comprising a plurality of delay portions and configured to convolutionally interleave the data cells of the service frames, a modulation symbol mapper configured to map the interleaved and encoded data cells of the service frames onto modulation cells, and a modulator configured to modulate the sub-carriers of one or more OFDM symbols with the modulation cells.

20 Claims, 19 Drawing Sheets

(51) Int. Cl.
*H04L 27/14* (2006.01)
*H04L 27/26* (2006.01)

(52) U.S. Cl.
CPC .......... *H04L 1/0045* (2013.01); *H04L 1/0047* (2013.01); *H04L 1/0059* (2013.01); *H04L 5/0007* (2013.01); *H04L 27/14* (2013.01); *H04L 27/2627* (2013.01); *H04L 27/2649* (2013.01)

(56) References Cited

U.S. PATENT DOCUMENTS

| | | | | |
|---|---|---|---|---|
| 2015/0003544 A1* | 1/2015 | Ouchi | .................. | H04L 1/0041 375/260 |
| 2016/0056922 A1* | 2/2016 | Baek | .................... | H04B 7/046 375/267 |
| 2016/0065277 A1* | 3/2016 | Moss | ................... | H04B 7/0413 375/267 |
| 2016/0105223 A1* | 4/2016 | Baek | .................... | H04L 5/0023 375/267 |

FOREIGN PATENT DOCUMENTS

| | | |
|---|---|---|
| EP | 0 892 501 A1 | 1/1999 |
| GB | 2512601 A | 10/2014 |
| WO | WO 2009/038353 A2 | 3/2009 |
| WO | WO 2009/038353 A3 | 3/2009 |

OTHER PUBLICATIONS

U.S. Appl. No. 14/780,303, filed Feb. 2016, Matthew Paul Athol Taylor.
U.S. Appl. No. 14/780,223, filed Feb. 2016, Matthew Paul Athol Taylor.

* cited by examiner

Framing concept for ATSC 3.0

TRANSMITTER AND METHOD OF TRANSMITTING AND RECEIVER AND METHOD OF RECEIVING

CROSS REFERENCE TO RELATED APPLICATIONS

This application is a continuation application of U.S. application Ser. No. 14/969,418, filed Dec. 15, 2015, which claims priority to United Kingdom Application 1422307.7 filed on 15 Dec. 2014 and to United Kingdom Application 1504207.0 filed on 12 Mar. 2015. The entire contents of the above-identified applications are incorporated herein by reference.

FIELD OF THE DISCLOSURE

The present disclosure relates to transmitters and methods of transmitting data and receivers and methods of receiving data, which has been interleaved in accordance with a convolutional interleaving scheme.

BACKGROUND OF THE DISCLOSURE

There are many examples of radio communication systems in which data is communicated by encoding the data to improve the likelihood of recovering the data at a receiver. As those acquainted with error correction encoding will appreciate, error correction encoding and decoding to recover payload data being communicated can perform better when the encoded data is interleaved so as to disperse the effect of any bursts of errors in the data symbols, so that the errors are separated as far as possible in the received symbol stream.

For example some systems use Orthogonal Frequency Division Multiplexing (OFDM) to transmit the data. For example Digital Video Broadcasting (DVB) standards, use OFDM, which is also being proposed for the Advanced Television System Communications (ATSC) standard of $3^{rd}$ generation (ATSC3.0). OFDM can generally be described as providing K narrowband sub-carriers (where K is an integer) which are modulated in parallel, each sub-carrier communicating a modulated data symbol, such as a Quadrature Amplitude Modulated (QAM) symbol or a Quaternary Phase-shift Keying (QPSK) symbol. The modulation of the sub-carriers is formed in the frequency domain and transformed into the time domain for transmission. Since the data symbols are communicated in parallel on the sub-carriers, the same modulated symbols may be communicated on each sub-carrier for an extended period, which can be longer than the coherence time of the radio channel. The sub-carriers are modulated in parallel contemporaneously, so that in combination the modulated carriers form an OFDM symbol. The OFDM symbol therefore comprises a plurality of sub-carriers, each of which has been modulated contemporaneously with different modulation symbols. During transmission, a guard interval filled by a cyclic prefix of the OFDM symbol precedes each OFDM symbol. When present, the guard interval is dimensioned to absorb any echoes of the transmitted signal that may arise from multipath propagation or other transmitters transmitting the same signal from a different geographic location. However one characteristic of OFDM is that errors in the received data stream can occur in bursts and so some form of interleaving is appropriate as mentioned above. The interleaving can be performed at the symbol level in which data symbols which are to be mapped onto the sub-carriers of the OFDM symbols are interleaved before being modulated onto the sub-carriers. The interleaving can also be performed at the bit level in which the bits of data before mapping onto the symbols for modulating the sub-carriers are interleaved/deinterleaved. Usually, communication systems include interleaving both at bit and symbol levels.

The simplest form of interleaving is block interleaving, in which data is written into memory row-wise and read-out column-wise or vice versa. The depth of such an interleaver can roughly be defined as the number of codewords that can be interleaved together. The effectiveness of an interleaver depends on its depth. Therefore, with large code words and a requirement for a large depth, the interleaver can demand a significant amount of memory, which can increase the cost of implementing receivers for interleaved data, which require a corresponding block deinterleaver. For this reason convolutional interleaving has been proposed, which as will be explained requires typically about half of the memory size of a block interleaver for the same interleaving depth. However for systems, such as television broadcast systems, in which data is transmitted in frames, convolutional interleaving can present some technical challenges.

SUMMARY OF DISCLOSURE

According to an aspect of the present disclosure there is provided a transmitter for transmitting data using Orthogonal Frequency Division, OFDM, symbols. The transmitter comprises a forward error correction encoder configured to encode the data to form forward error correction encoded frames of encoded data cells. A service frame builder is configured to form a service frame for transmission comprising a plurality of the forward error correction encoded frames. A convolutional interleaver comprising a plurality of delay portions and configured to convolutionally interleave the encoded data cells of the plurality of the forward error correction encoded frames of the service frames, a modulation symbol mapper configured to map the interleaved and encoded data cells of the service frames onto modulation cells, and a modulator configured to modulate one or more carriers with the modulation cells for transmission. A controller is configured to form signalling data to be transmitted with the service frames to include an indication of an identified first of the encoded data cells of a first of the plurality of forward error correction encoded frames of a service frame which can be decoded from encoded data cells received from the service frame or the service frame and one or more other service frames following after the service frame.

Embodiments of the present technique can be arranged to detect the first cell of a first of the error correction encoded frames of a new service frame which does not have any data cells in one or more previous service frames as a result of the convolutional interleaving then a receiver, which has acquired the new service frame but none of the one or more previous service frames can decode this first forward error correction encoded frame of the new service frame and ignore the other forward error correction encoded frames earlier in the service frame. Therefore for example a receiver may power on or change channels during a previous service frame and be directed to only decode a forward error correction encoded frame that it can receive completely.

According to some embodiments, the controller is configured to calculate a displacement value (A) representing a minimum displacement from the first cell of the service frame of a first cell of a first of the forward error correction frames, for which none of the data cells of the forward error correction frame will be transmitted in one or more previous service frames; and to form the signalling data to be transmitted to the receiver to include the identified first cell of the first of the forward error correction frame of the service frame which can be decoded from cells received from the new service frame. According to a further aspect of the present technique there is provided a receiver for recovering data symbols from a received signal. The receiver comprises a demodulator configured to detect the received signal comprising an interleaved symbol stream comprising a sequence of service frames (ATSC frames), each service frame including one or more forward error correction encoded frames of data cells, which have been interleaved by a convolutional interleaver. The receiver includes a convolutional deinterleaver circuitry configured to perform a convolutional deinterleaving of the received data cells, a forward error correction decoder configured to decode the encoded frames of data cells, and controller circuitry. The controller circuitry is configured to detect a new service frame, to detect from which of a plurality of delay portions of the convolutional deinterleaver a first service frame data symbol of the new service frame is read, to detect the number of the service frame data cells of the new service frame after which a first forward error correction frame is read, and to detect, based upon the detected new service frame, the delay portion from which the first new service frame data symbol of the new service frame is read, and the number of the service frame data cells of the new service frame after which a first forward error correction frame is read, whether any data cells of the first forward error correction frame were transmitted in a previous service frame. If any of the data cells of the first forward error correction frame were transmitted in a previous service frame not received by the receiver, not to decode the first forward error correction frame, or if no data cells of the new forward error correction frame were transmitted in the previous service frame, or if any data cells of the new forward error correction frame were transmitted in a received previous service frame, to decode the new forward error correction frame.

Embodiments of the present technique can provide an arrangement in which the receiver is arranged to detect a condition in which after initially acquiring the start of a new service frame and an indication of a point in the service frame at which a new error correction encoded frame begins, a receiver cannot recover all of the symbols which have been encoded in the error correction encoded frame and therefore discards the error correction encoded frame and awaits the next error correction encoded frame before decoding the next error correction encoded frame to recover the service data. This is because, as a result of the convolutional interleaving, one or more data cells of the error correction encoded frame have been transmitted in a previous service frame, which may not have been received. The present technique therefore recognises a problem in which when a receiver is initially powered up or changes channel to the received symbol stream and detects a start of a new service frame, and, as a result of a latency in the convolutional interleaver, if a new error correction encoded frame starts too close to the start of the service frame then not all of the symbols of the error correction encoded frame can be recovered from the new service frame because some of these have been transmitted in the previous service frame as a result of the convolutional interleaving. The condition for detecting whether the new error correction encoded frame can be recovered from the new service frame is dependent upon a position in which the convolutional encoder starts in respect of a new row of the interleaver with respect to the new service frame.

In some examples, the receiver determines a row of the convolutional deinterleaver for the new service frame in accordance with a pre-determined arrangement in which a previous service frame finishes at a commutator of the convolutional interleaver on a pre-determined row whereas other examples provide an arrangement for signalling the row of the convolutional interleaver in which the first symbol or cell of the new frame be input. Furthermore, in some examples, the first symbol or cell of the new service frame in which the new error correction encoded frame starts is signalled to the receiver whereas in other examples the start of the error correction encoded frame within the new service frame is detected by the receiver in accordance with the pre-determined arrangement.

As will be explained below, calculation of the displacement of the first encoded data cell of a forward error correction encoded frame of a service frame from the first encoded data cell of the service frame, which ensures that the error correction encoded data frame can be decoded differs for different forms of the convolutional interleaver and deinterleaver.

Various further aspects and features of the disclosure are defined in the appended claims, which include a method of receiving, a data processing apparatus and a television receiver.

BRIEF DESCRIPTION OF THE DRAWINGS

Embodiments of the present disclosure will now be described by way of example only with reference to the accompanying drawings wherein like parts are provided with corresponding reference numerals and in which.

DESCRIPTION OF EXAMPLE EMBODIMENTS

Embodiments of the present disclosure can be arranged to form a transmission network for transmitting signals representing data including video data and audio data so that the transmission network can, for example, form a broadcast network for transmitting television signals to television receiving devices. In some examples the devices for receiving the audio/video of the television signals may be mobile devices in which the television signals are received while on the move. In other examples the audio/video data may be received by conventional television receivers which may be stationary and may be connected to a fixed antenna or antennas.

Television receivers may or may not include an integrated display for television images and may be recorder devices including multiple tuners and demodulators. The antenna(s) may be inbuilt to television receiver devices. The connected or inbuilt antenna(s) may be used to facilitate reception of different signals as well as television signals. Embodiments of the present disclosure are therefore configured to facilitate the reception of audio/video data representing television programs to different types of devices in different environments.

Figure 1:
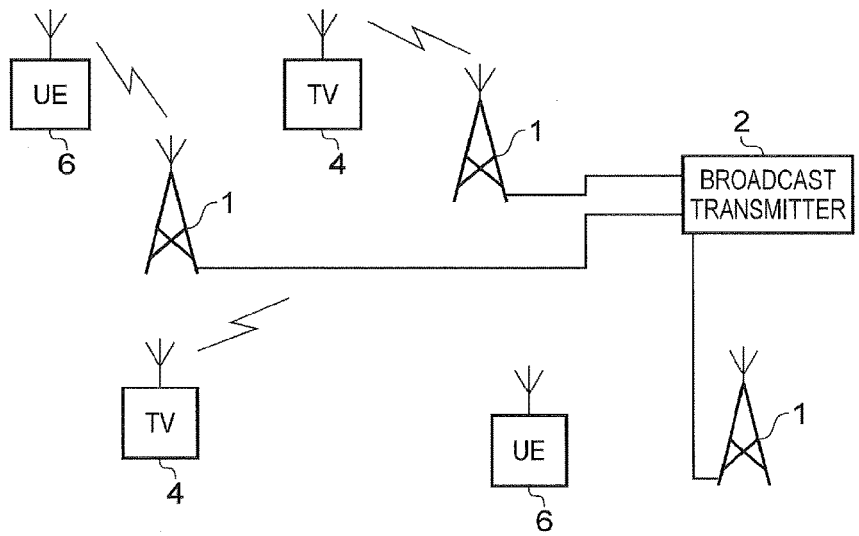
FIG. 1 is a schematic diagram illustrating an arrangement of a broadcast transmission network.

An example illustration of a television broadcast system is shown in FIG. 1. In FIG. 1 broadcast television base stations 1 are shown to be connected to a broadcast transmitter 2. The broadcast transmitter 2 transmits signals from base stations 1 within a coverage area provided by the broadcast network. The television broadcast network shown in FIG. 1 operates as a so called single frequency network in which each of the television broadcast base stations 1 transmit the radio signals conveying audio/video data contemporaneously so that these can be received by television receivers 4 as well as mobile devices 6 within a coverage area provided by the broadcast network. For the example shown in FIG. 1 the signals transmitted by the broadcast base stations 1 are transmitted using Orthogonal Frequency Division Multiplexing (OFDM) which can provide an arrangement for transmitting the same signals from each of the broadcast stations 2 which can be combined by a television receiver even if these signals are transmitted from different base stations 1. Provided a spacing of the broadcast base stations 1 is such that the propagation time between the signals transmitted by different broadcast base stations 1 is less than or does not substantially exceed a guard interval that precedes the transmission of each of the OFDM symbols then a receiver device 4, 6 can receive the OFDM symbols and recover data from the OFDM symbols in a way which combines the signals transmitted from the different broadcast base stations 1. Examples of standards for broadcast networks that employ OFDM in this way include DVB-T, DVB-T2, ATSC 3.0 and ISDB-T.

Figure 2:
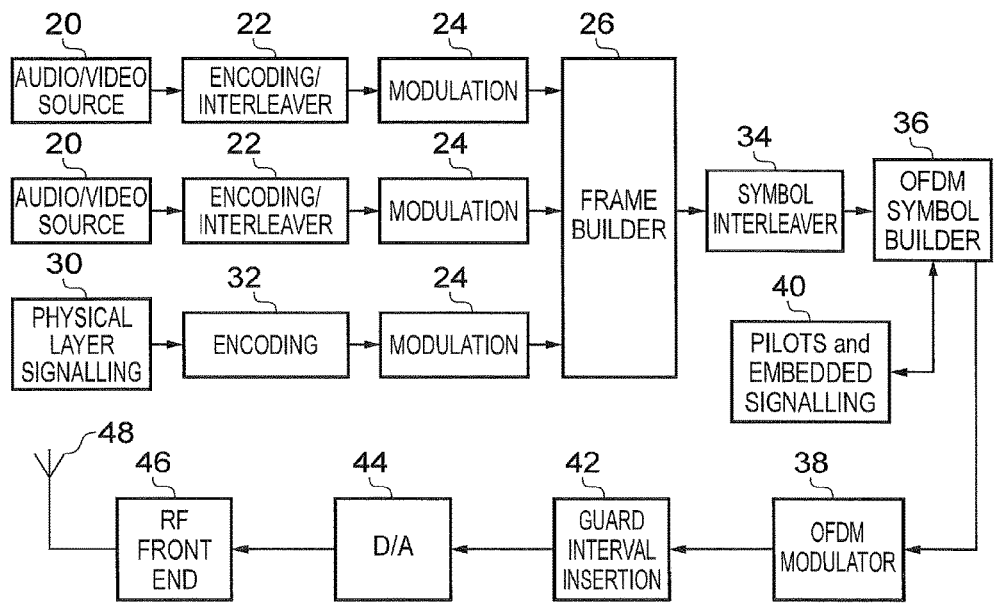
FIG. 2 is a schematic block diagram illustrating an example transmission chain for transmitting broadcast data via the transmission network of FIG. 1.

An example block diagram of a transmitter forming part of the television broadcast base stations 1 for transmitting data from audio/video sources is shown in FIG. 2. In FIG. 2 audio/video sources 20 generate the audio/video data representing television programmes, each of which can be thought of as source data for transmission via different physical layer pipes (PLP). The audio/video data is encoded using forward error correction encoding by an encoding/interleaver block 22 which generates forward error correction encoded data frames. A stream of forward error correction (FEC) encoded data frames therefore forms a physical layer pipe. Encoded data symbols, also referred to in the following description as data cells, are formed into FEC frames are therefore transmitted as a PLP within each of the transmission frames, which are referred to as service frames, or according to the ATSC standard, ATSC frames.

The encoded data cells of the FEC frames are fed to a modulation unit 24 which maps the encoded data onto modulation symbols which are used to modulate OFDM symbols. The modulation symbols are generated in accordance with a modulation scheme such as mQAM, which may be uniform or non-uniform and where m is typically equal to $2^n$, where n is an integer. Accordingly, in the following description in order to avoid confusion with OFDM symbols, the modulation symbols will be referred to as cells or QAM cells, although it will be appreciated that embodiments of the present technique are not limited to QAM.

Depicted on a separate lower arm, signalling data providing physical layer signalling for indicating for example the format of coding and modulation of the audio/video data is generated by a physical layer signalling unit 30 and after being encoded by an encoding unit 32 the physical layer signalling data is then modulated by a modulation unit 24 as with the audio/video data.

A frame builder 26 is arranged to form the data to be transmitted with the physical layer data into a frame for transmission, which combines a plurality of physical layer pipes (PLPs) each of which carries the data from one of the audio/video television programme sources 20. The service frame includes a time divided section having a preamble in which the physical layer signalling is transmitted and one or more data transmission sections, which transmit the audio/video data generated by the audio/video sources 20. A symbol or frequency interleaver 34 may interleave the data which is formed into symbols for transmission before being modulated by an OFDM symbol builder 36 and an OFDM modulator 38. The OFDM symbol builder 36 receives pilot signals which are generated by a pilot and embedded data generator 40 and fed to the OFDM symbol builder 36 for transmission. An output of the OFDM modulator 38 is passed to a guard insertion unit 42 which inserts a guard interval and the resulting signal is fed to a digital to analogue convertor 44 and then to an RF front end 46 before being transmitted by an antenna 48.

Figure 3:
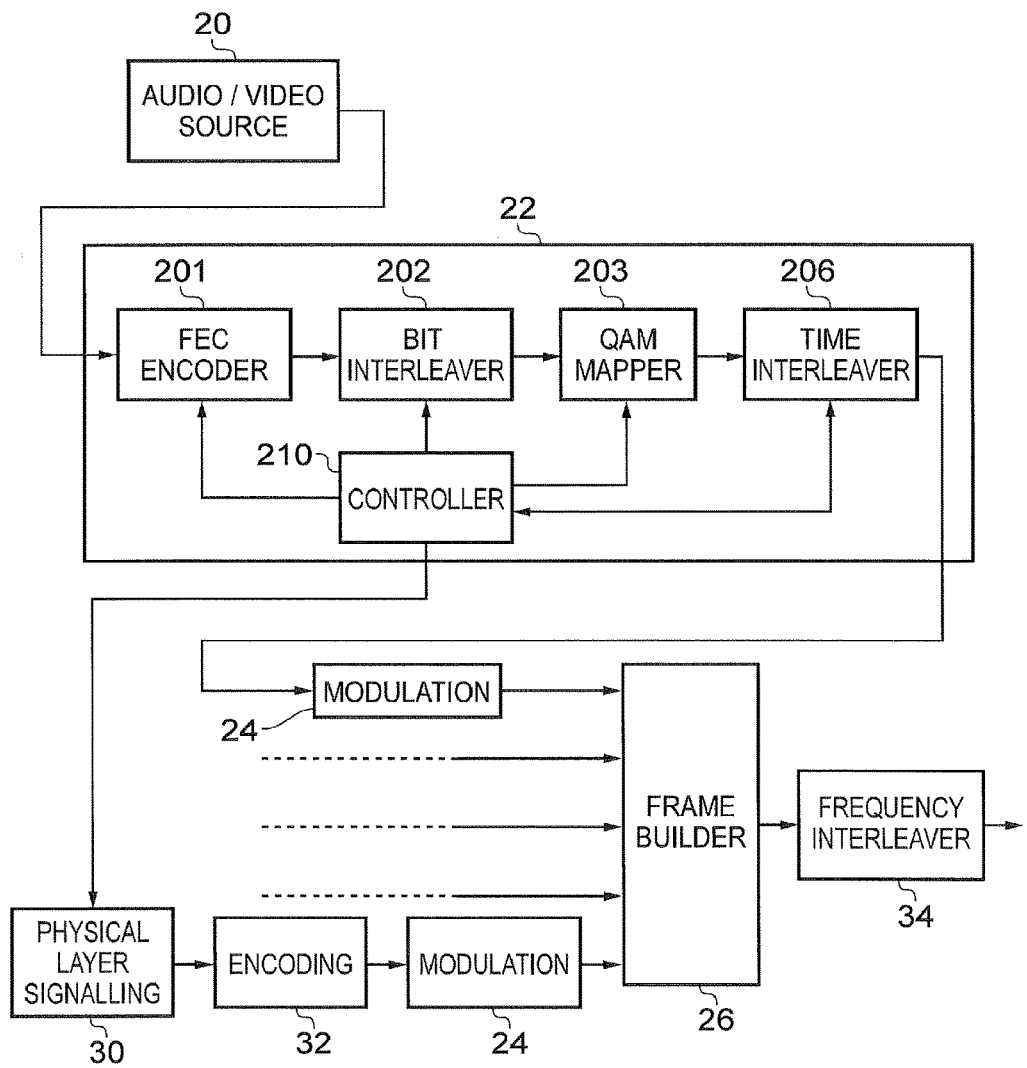
FIG. 3 is a schematic block diagram showing parts of the transmitter shown in FIG. 2, which perform error correction encoding and interleaving.

FIG. 3 shows a block diagram of example data processing elements which may form part of the encoding/interleaving block 22 shown in FIG. 2. In FIG. 2, the audio/video source block 20 provides the source data for transmission to an FEC encoder 201, possible via intermediate elements. As explained above, a forward error correction (FEC) 202 encoder performs error correction encoding of the data. The output of the forward error correction (FEC) encoder 202 is a vector of bits that may then be processed by other blocks, for example a bit interleaver 202 may be arranged to preform interleaving of the encoded data bits for transmission. The output of the bit interleaver 202 is fed to a QAM mapper 203, which forms the encoded data bits into groups of bits in accordance with a modulation scheme, which has been selected by the controller 208. The groups of bits may, for example define a cell such as a QAM cell, because the content of the group of data bits defines the QAM modulation symbol, which is used to modulate a carrier signal, such as for example a sub-carrier of an OFDM symbol. The QAM cells are fed from the output of the QAM mapper 203 to a time interleaver 206. The output from the QAM mapper 203 may comprise the groups of one or more bits for selecting constellation points or constellation points represented by real and imaginary components. As mentioned above, the constellation points represent cells representing the one or more bits depending on the modulation scheme used, which may be, for example, BPSK, QPSK, QAM, 16QAM etc., wherein the constellation points are either uniformly or non-uniformly spaced.

The stream of QAM cells is then input to a time interleaver 203 which interleaves the symbols from various FEC frames across time. The time interleaver 203 interleaves input the QAM cells from across one or more FEC code words or frames, thereby creating a more uniform distribution of errors in cases where errors may occur in bursts in time or frequency. The interleaved symbols then enter the modulator 24 as shown in FIG. 2 and are converted into modulation cells and then fed to a frame builder 205, which combines these QAM cells from other sources with other symbols which are used to convey information about the format of the transmission, into a set of cells which will be referred to as a physical layer frame or service frame. A frame may then be processed by further blocks which modulate the frame onto for example a set of OFDM symbols, which are then used to modulate an RF signal for transmission over a radio channel or a cable channel.

Although FIG. 3 depicts four elements, the transmitter 2 may also comprise a number of other elements common to the transmission of a digital signal, such as a multiplexer, a compression coder and signal amplifiers etc.

Figure 4:
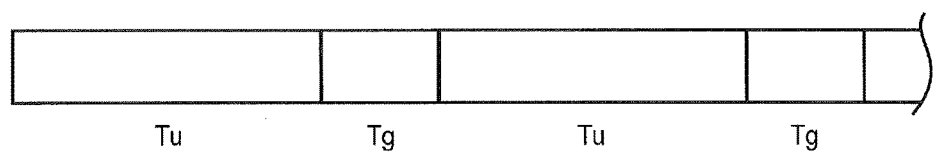
FIG. 4 is a schematic illustration of OFDM symbols in the time domain which include a guard interval.

As with a conventional arrangement, OFDM is arranged to generate symbols in the frequency domain in which QAM cells to be transmitted are mapped onto sub carriers which are then converted into the time domain using an inverse Fourier Transform. Thus the data to be transmitted is formed in the frequency domain and transmitted in the time domain. As shown in FIG. 4 each time domain symbol is generated with a useful part of duration Tu and a guard interval of duration Tg. The guard interval is generated by copying a part of the useful part of the symbol in the time domain. By correlating the useful part of the burst with the guard interval, a receiver can be arranged to detect the useful part of the OFDM symbol Tu, from which data can then be recovered from an OFDM symbol by triggering a Fast Fourier Transform to convert the time domain symbol samples into the frequency domain. Such a receiver is shown in FIG. 5.

Figure 5:
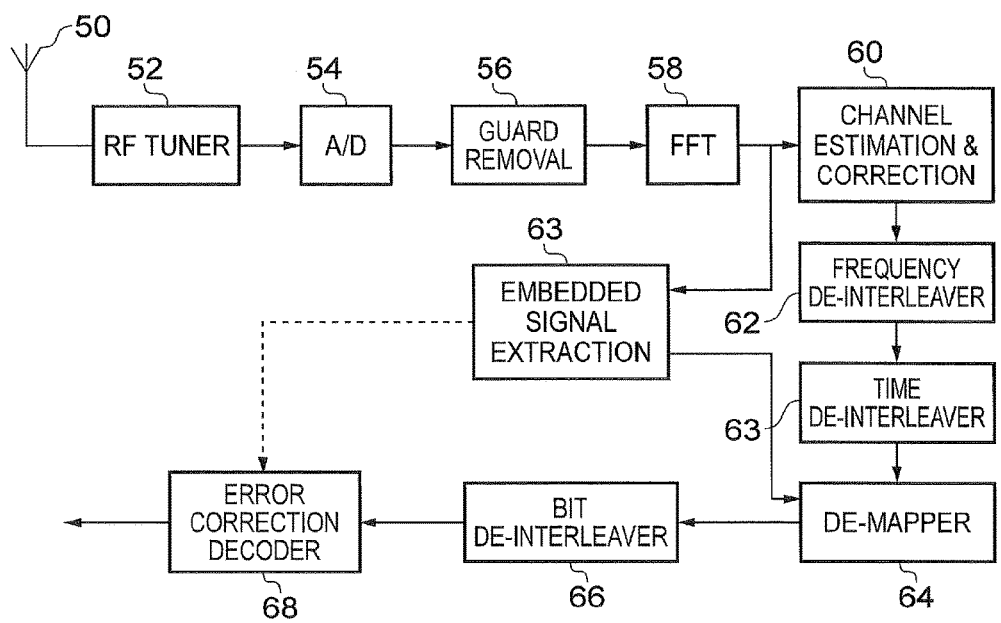
FIG. 5 is a schematic block of a typical receiver for receiving data broadcast by the broadcast transmission network of FIG. 1 using OFDM.

In FIG. 5 a receiver antenna 50 is arranged to detect an RF signal which is passed via a tuner 52 and converted into a digital signal using an analogue to digital converter 54 before the guard interval is removed by a guard interval removal unit 56. After detecting the optimum position for performing a fast Fourier Transform (FFT) to convert the time domain samples into the frequency domain, an FFT unit 58 transforms the time domain samples to form the frequency domain samples which are fed to a channel estimation and correction unit 60. The channel estimation and correction unit 60 then estimates the transmission channel for example by using pilot sub-carriers which have been embedded into the OFDM symbols. After excluding the pilot sub-carriers, all the data-bearing sub-carriers are fed to a frequency deinterleaver 62 which deinterleaves the QAM cells received from the sub-carriers of the OFDM symbols, to reverse the operation performed by the frequency interleaver 34 in the transmitter. A time deinterleaver 63 performs an operation to deinterleave the QAM cells in the received service frame. A de-mapper unit 64 then extracts the data bits from the QAM cells provided from the time and frequency de-interleaved sub-carriers of the OFDM symbol. The data bits are fed to a bit deinterleaver 66, which performs the de-interleaving so that the error correction decoder 68 can correct errors in accordance with a conventional operation.

Framing Structure

Figure 6:
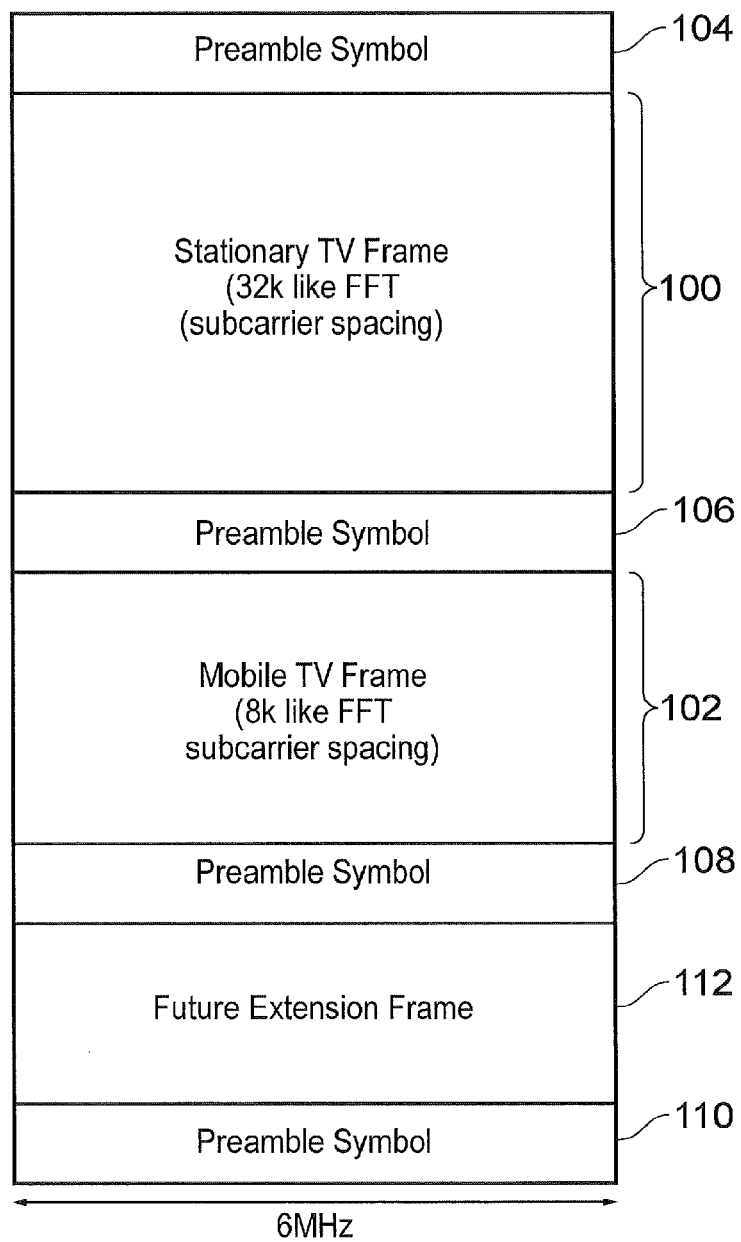
FIG. 6 is a schematic illustration of a transmission frame for transmitting broadcast data including payload data and signalling data.

FIG. 6 shows a schematic of the framing structure according to an example embodiment of the present technique. FIG. 6 illustrates different physical layer frames, some targeted for mobile reception whilst others are targeted for fixed roof-top antenna reception. The system can be expanded in future to incorporate new types of frames, for the current system, these potential new types of frames are simply known as future extension frames (FEFs).

One requirement for fixed reception frames is an improved spectral efficiency which may be assured by such features as adopting a higher order modulation, for example 256QAM, and higher code rates, for example greater than half rate, because of relatively benign channel conditions, and a high number of sub-carriers per OFDM symbol (FFT size) such as 32K. This reduces the capacity loss due to the guard interval fraction. However, a higher number of sub-carriers can make such OFDM symbols unsuitable for mobile reception because of lower tolerance to high Doppler frequency of the received signal. On the other hand, the main requirement for mobile reception frames could be robustness in order to ensure a high rate of service availability. This can be improved by adopting such features as a low order modulation for example QPSK or BPSK, low code rates, a low number of sub-carriers per OFDM symbol (FFT size) and a high density scattered pilot pattern etc. A low number of sub-carriers for OFDM symbols can be advantageous for mobile reception because a lower number of sub-carriers can provide a wider sub-carrier spacing and so more resilience to high Doppler frequency. Furthermore a high density pilot pattern eases channel estimation in the presence of Doppler.

The framing structure shown in FIG. 6 is therefore characterised by frames which may each include payload data modulated and encoded using different parameters. This may include for example using different OFDM symbol types having different number of sub-carriers per symbol, which may be modulated using different modulation schemes, because different frames may be provided for different types of receiver. However each frame may include at least one OFDM symbol carrying signalling data, which may have been modulated differently to the one or more OFDM symbols carrying the payload data. Furthermore the signalling OFDM symbol may be a different type to the OFDM symbol(s) carrying the payload data. The signalling data is required to be recovered so that the payload data may be de-modulated and decoded.

Figure 7:
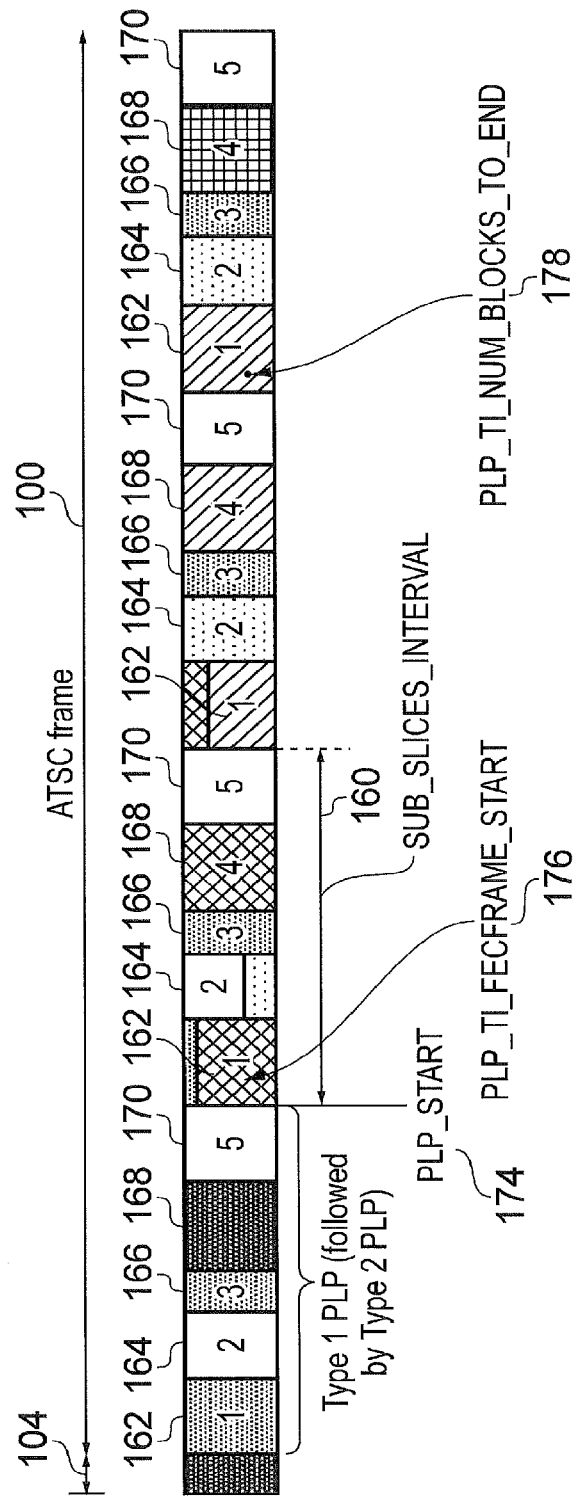
FIG. 7 is a schematic illustration of a part of the transmission frame shown in FIG. 5, showing an example arrangement in which physical layer pipes are arranged within subintervals of a service frame, such as an ATSC frame.

FIG. 7 provides an alternative view of an example of a physical layer frame or service frame structure, which may be used to deliver the services via physical layer pipes (PLP) provided by the transmitted of FIG. 1. As shown in FIG. 7 an ATSC frame or service frame 100, which may therefore correspond in one example to the stationary TV frame 100 shown in FIG. 6, comprises a plurality of sub-slices 160, each of which comprises in time and frequency a section of OFDM sub-carriers 162, 164, 166, 168, 170 on which each of five physical layer pipes are carried (1, 2, 3, 4, 5). Also shown in FIG. 7 and of particular relevance in the following explanation, in some examples physical layer signalling (layer 1 signalling) can provide an indication of the sub-carrier and a time at which a first of the symbols or cells of a PLP is transmitted (PLP_START) 174. The physical layer signalling may also provide an indication of the first symbol or cell of the first forward error correction (FEC) word of the service that starts in the current frame or sub-slice interval (PLP_TI_FECFRAME_START) 176 and an indication of a number of blocks to the end of the PLP (PLP_TI_NUM_B-LOCKS_TO_END) 178.

Figure 8:
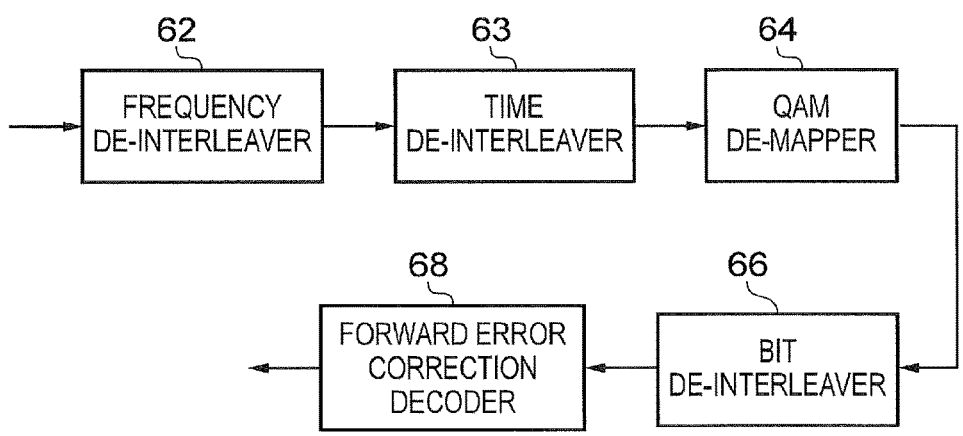
FIG. 8 is a schematic block diagram showing parts of the receiver shown in FIG. 4, which perform deinterleaving and error correction decoding.

FIG. 8 provides a block diagram of example data processing elements that may comprise the receivers 4, 6 where the receivers 4, 6 are operable to receive the signal transmitted by the transmitter 2, representing a sequence of FEC frames shown in FIGS. 1 and 2. The transmitted signal comprising the symbols of one or many FEC frames from one or several audio/video (AV) sources is separated, after potentially performing channel estimation and correction, into symbol streams formed in accordance with the AV sources to which the streams belong. Each stream is then de-interleaved. The frequency deinterleaver 62 is configured to deinterleave the QAM modulation symbols (cells) received from the sub-carriers of the OFDM symbols. The time deinterleaver 63 performs a time deinterleaving of the QAM cells of the received service frame for the PLP and reverses the time interleaving performed by the time interleaver 206. The output of the time deinterleaver 63 then may pass through a QAM demapper 64, which converts the QAM cells (symbols) to a stream of bits. The received stream of bits are then deinterleaved by a bit deinterleaver 66 before being passed to a FEC decoder 68 which attempts to correct any errors in the data.

Interleaving is often used in digital communication systems to improve the performance of forward error correcting codes. In many communication channels, errors often occur in bursts rather than in isolation or independently. If the number of errors within a code word exceeds the error-correcting code's capability, the error correction process may fail to recover the original code word. Interleaving ameliorates this problem by shuffling source symbols across several code words, thereby creating a more uniform distribution of errors. These code words are generally transmitted sequentially in time; hence the name "time-interleaving" because this stream of symbols is then interleaved in time. However, interleaving may also be done in the frequency domain so that in OFDM systems symbols may be distributed across different frequencies.

One method of performing interleaving is called block interleaving. This is used to implement the time-interleaving in many digital communication systems, for example DVB-T2. In a block interleaver blocks of symbols are interleaved and these blocks may be referred to as interleaving-frames. Another method of performing interleaving is convolutional interleaving. Convolutional interleaving is also known and used in digital communication systems, for example ISDB-T. The advantage of a convolutional interleaver is that it generally uses half the amount of memory that is required for block interleaving, whilst giving similar performance. There are, however, disadvantages of convolutional interleaving when compared to block interleaving. For example, the resulting interleaved data is continuous, rather than being naturally divided into discrete interleaving frames. This means that it may not be possible to change the interleaver parameters whilst the interleaver or deinterleaver is running Secondly, the size of a convolutional interleaver needs to be related to other parameters of the communication system in which it is operating so the deinterleaver at the receiver can be synchronised with the interleaver at the transmitter.

Figure 9:
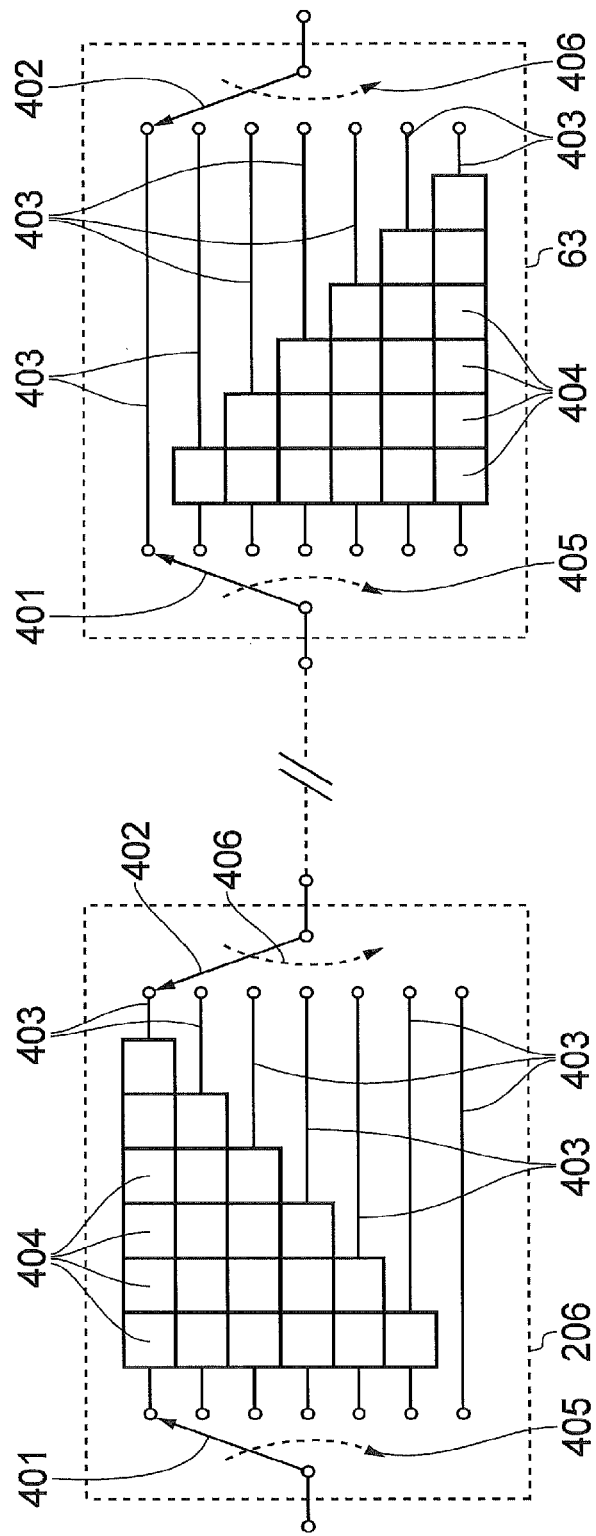
FIG. 9 is a schematic block diagram of a convolutional interleaver and a convolutional deinterleaver, which form part of the transmitter and the receiver of FIGS. 2 and 4.
Figure 19:
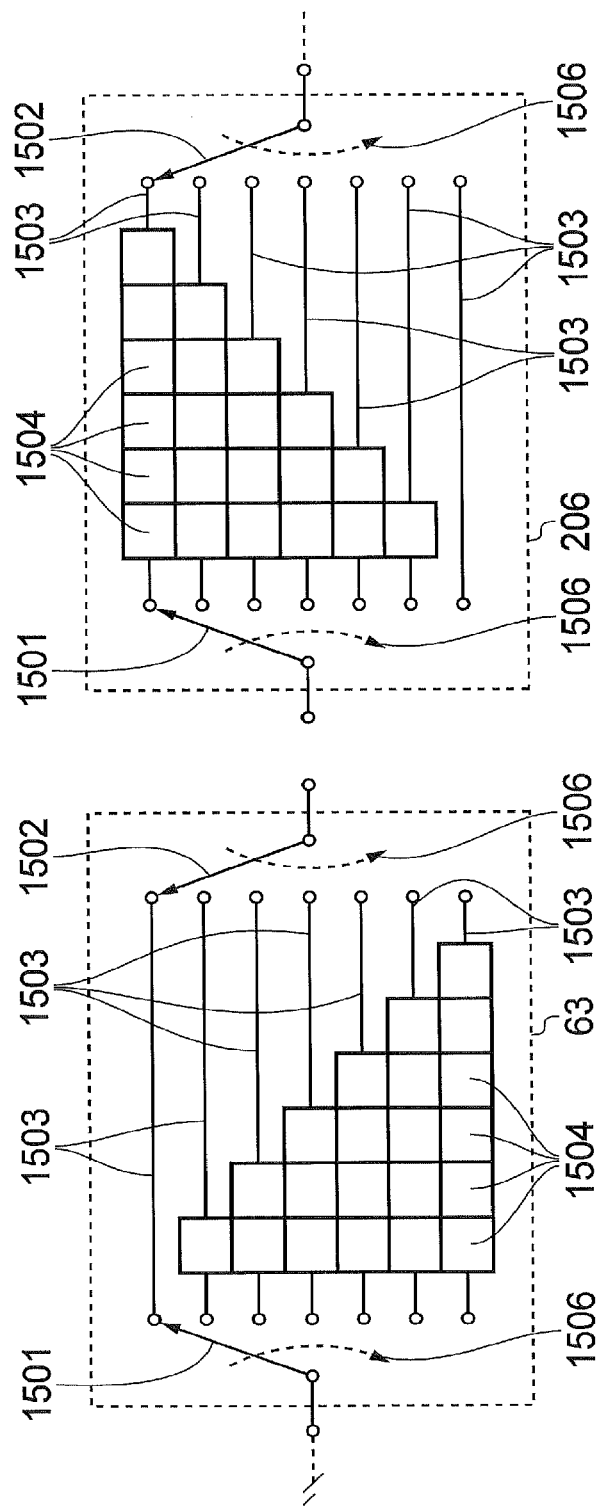
FIG. 19 is a schematic block diagram of a further alternative arrangement for a convolutional interleaver and a convolutional deinterleaver, which could form the transmitter and the receiver of FIGS. 2 and 4.

FIG. 9 illustrates the internal operation of a convolutional interleaver, such as the time interleaver 206 depicted in FIG. 3, which would typically be found in the transmitter side of a digital communication system as depicted in FIG. 1. FIG. 9 also illustrates the internal operation of a convolutional deinterleaver, such as the time deinterleaver 63 depicted in FIGS. 5 and 8, which would typically be found in the receiver side of a digital communication system as depicted in FIG. 1. However as explained below, there is an alternative arrangement which could be used for the convolutional interleaver 206 and the convolutional deinterleaver 63, which is illustrated in FIG. 19, in which the rows of delay elements are inverted with respect to the arrangement shown in FIG. 9.

The interleaver 206 and the deinterleaver 63 each comprise an input commutator 401, an output commutator 402 and a plurality of delay portions 403, where the delay portions may also be referred to as interleaver/deinterleaver rows due to their layout in the interleaver and deinterleaver visualisations. The input commutator 401 is operable to input symbols into a delay portion and the output commutator 402 is operable to read out symbols from the delay portions. In some examples the input and output commutators 401, 402 may be synchronised such that they input and read out symbols from the same delay portion, however, they may also be unsynchronised such that they input and read out symbols from different delay portions. The commutators 401, 402 may for example become unsynchronised in the interleaver when output commutator 402 does not read out a symbol from a delay portion but the input commutator 401 continues to input a symbol to said delay portion. As will be appreciated, the term commutator may be replaced with the term 'selector' or 'commuter' without any intended change of meaning or function.

The plurality of delay portions 404 are arranged to delay symbols by different amounts from when a symbol is input into a selected delay portion by the input commutator 401 and read out from the selected delay portion by the output commutator 402. At least one of the delay portions is made up of one or more memories or memory elements 404 where the delay introduced by a delay portion is partially dependent upon the number of memory elements the delay portion comprises. The number of symbols a delay portion is operable to store or delay at any one time is dependent on the number of memory elements the delay element comprises. In some examples the arrangement of the memory elements 404 may be said to form columns which are analogous to the interleaver/deinterleaver rows mentioned above. Each memory element may be associated with a memory location in an interleaver/deinterleaver memory which is operable to store a symbol input into a delay portion. The delay portions 403 are arranged in a sequence such as that illustrated in FIG. 9, where the delay portions 403 in the interleaver 206 are arranged in an order corresponding to decreasing delay i.e. decreasing number memory elements, and the delay portions 403 in the deinterleaver 302 are arranged corresponding to increasing delay i.e. increasing number of memory elements. However, the sequence of delay portions 403 may be arranged in any sequence depending upon the interleaving pattern or sequence required. The input commutator 401 is configured to input symbols from an input sequence in accordance with the sequence of the delay portions 404 as shown by the dashed line 405. Likewise, the output commutator 402 is configured to read symbols from the delay portions in accordance with the sequence of the delay portions 403 as shown by the dashed lines 406 to form a deinterleaved symbol stream.

The input to the convolutional interleaver 206 may be a stream of bits, symbols, blocks of bits or symbols etc. The term symbol used throughout this description includes all these cases, or the term cell may be used because the data symbol may have been carried by a sub-carrier of an OFDM symbol, such as in the case of this example. Each symbol from a symbol stream is input by an input commutator 401, the commutators advance one delay portion downwards after the input of a symbol, wrapping round back to the top after the bottom delay portion. Each time a symbol is read out of or input to a delay portion 403 symbols remaining in the delay portions 403 are shifted towards the output commutator 402 by one or more memory elements such that at least the memory element nearest to the input commutator becomes vacant i.e. no longer contains useful data. During normal operation the next symbol from the interleaved or deinterleaved stream of symbols is input into the vacant memory element by the input commutator 401. In the case of the delay portion, which does not comprise any memory elements 404, the symbol input by the input commutator 401 is immediately output or read out by the commutator 402 before the commutators advance one delay portion downwards. Consequently, the delay between the input of a symbol from the stream of symbols into a delay portion and the output or reading-out of the same symbol from the delay portion is dependent upon the number of memory elements 404 in the delay portion and the frequency that symbols are input or read out from the delay portion 403. Although in the description above the commutators 401, 402 move in a downward direction, they may also move in an upwards direction after the input and reading-out of symbols from each delay portion 403. In some circumstances a symbol may be output, without the use of the output commutator, from a delay portion in response to the input of a symbol to the delay portion by the input commutator 401 and is not read directly into the interleaved/deinterleaved symbol stream.

As can be seen in FIG. 9, as a result of the different delays introduced by the delay portions 403 of the interleaver 206, the stream of symbols input into the interleaver 206 or deinterleaver 64 will be read-out in a different interleaved or deinterleaved order, respectively, which is dependent on the number of delay portions, the delay introduced by each delay portion, and the sequence of the delay portions. As can also be seen in FIG. 9, the deinterleaver 64 has a structure that corresponds to that of the interleaver 206 such that the interleaved symbols inputted into the deinterleaver are read-out in the deinterleaved order of the stream of symbols that were input into the interleaver at the transmitter.

As will be appreciated from the structure of the interleaver, each row provides a difference delay. As such, one symbol entering the last row will be transmitted without delay, while the next input symbol (to the $1^{st}$ row) will be output with a long delay. Thus it may happen that an FEC Frame start is transmitted in a particular service (ATSC) frame, but following symbols, belonging to the same FEC Frame, are transmitted in previous service frames. The receiver may then see the start of a FEC Frame in one frame, but is still not be able to recover the complete FEC Frame, because one or more symbols of the FEC frame have already been transmitted in previous service frames. A problem will therefore occur, when a receiver switches initially to this service, although it does not occur, when the receiver is in "steady-state".

Although in FIG. 9 the interleaver 206 and the deinterleaver 302 are illustrated as comprising rows and columns of memory elements, convolutional interleaving may also be represented via other visualisation. For example, they may be represented via the use of matrices where the size of a matrix and its elements determine the delay and therefore the interleaving/deinterleaving of the input/output symbol stream. Furthermore, the elements of the interleaver and deinterleaver described above and throughout the application may be implemented on a multipurpose or dedicated processor chip, where the functionality of the interleaver and deinterleaver is equivalent to that described but the implementation differs from the visualisations that are illustrated and described. For instance, the delaying of symbols and the input and output of symbols may be performed via memory address manipulation as opposed to the physical transfer of data representing symbols between memory elements and locations.

Further example arrangements of convolutional interleavering/de-interleaving are disclosed in our co-pending patent applications PCT/GB2014/050971 and GB 1305943.1 the contents of which are incorporated herein by reference.

Figure 10:
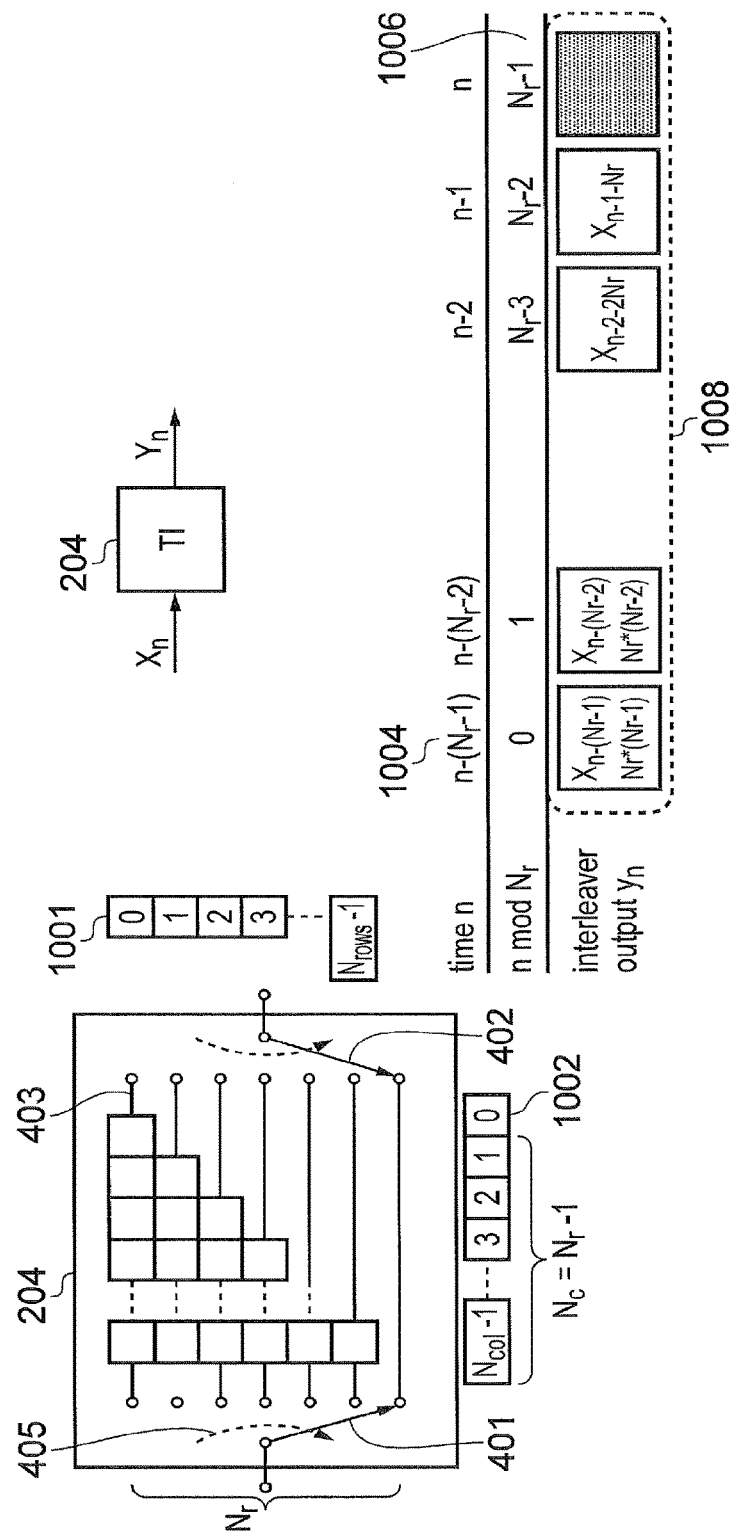
FIG. 10 is a part schematic block diagram, part schematic illustration of a function of the convolutional interleaver of FIG. 9.

FIG. 10 provides a representation of the convolutional interleaver shown in FIG. 9, which is presented to provide an explanation of the formulae used to explain the operation of the interleaver. As shown in FIG. 10, the interleaver provides an arrangement for determining the output symbol $Y_n$ given an input symbol $X_n$ as presented by the following equations:

$y_n = \text{int}(x_n) = x_m$ with $m = n - [(N_r - 1) - (n \bmod N_r)] * N_r$ (output $y_n$ is given by $x_m$)

$x_n = \text{int}^{-1}(y_m)$ with $m = n + [(N_r - 1) - (n \bmod N_r)] * N_r$ (input $x_n$ is interleaved to $y_m$) group of subsequent $N_r$ cells $y_n$ described by above rule next group: all indices shifted by $N_r$.

As shown in FIG. 10 the convolutional interleaver 206 as it appears in FIG. 9 is shown with reference to a number of rows $N_r$ of delay elements 1001 and $N_c = N_r - 1$ columns of delay elements 1002 in order to explain the terminology used in the following explanation. As shown the function of the convolutional interleaver is to perform a time interleaving (TI), of the input symbols $X_n$ to form the output symbol stream $Y_n$. As shown in FIG. 10 in a first row of cell indices n 1004 with respect to n mod $N_r$ indices 1006 the input signals $X_n$ as they appear at the output of the interleaver $Y_n$ are shown within a group of $N_r$ cells 1008 which represents a cycle of interleaving performed by the interleaver 206.

As will be appreciated with an input to the time interleaver being a sequence of cells $g_q$, the time interleaved sequence will consists of $N_r$ delay lines, with the k-th line having $N_r$-k-1 memory units, k=0, 1, ..., $N_r$-1. Thus, the number of rows in FIG. 10 is $N_r$-1. The input and output commutators, cyclically switch downwards after one symbol is written in or read out, respectively. At each cycle, they will be located in the same position k. The total number of memory units is $N_r \cdot (N_r - 1)/2$. If the input commutator is located at position k, an input symbol $g_q$ will be written to this delay line. The delay elements from this line will shift their memory content to the right-most memory element, respectively, and the content from the right-most memory element will be output via the output commutator. Next, the input symbol $g_q$ can be written to the left-most delay element of this line. Both commutators will then move cyclically to the next line (k+1) modulo $N_r$. In case, the commutators have been located at the last line, k=$N_r$-1, the input symbol is directly read out via the output commutator.

In some examples, the initial content of the $N_r \cdot (N_r - 1)/2$ memory elements shall be a CAZAC sequence, to allow for constant transmit power on the one hand, and to minimize peak-to-average-power-ratio (PAPR) effects after IFFT. In other examples the memory elements may be filled with "dummy insertion" symbols, as disclosed in section 8.3.8 of the DVB-T2 specification, the contents of which are incorporated herein by reference. However, the interleaved version of this sequence may not be optimum in terms of PAPR. In another example the memory elements may be initially filled with 0 (or whatever value, which will never appear). Then, each 0 after interleaving may be replaced by the sequence from dummy cell insertion (or CAZAC or whatever), rather than the initial input to the interleaver.

Figure 11:
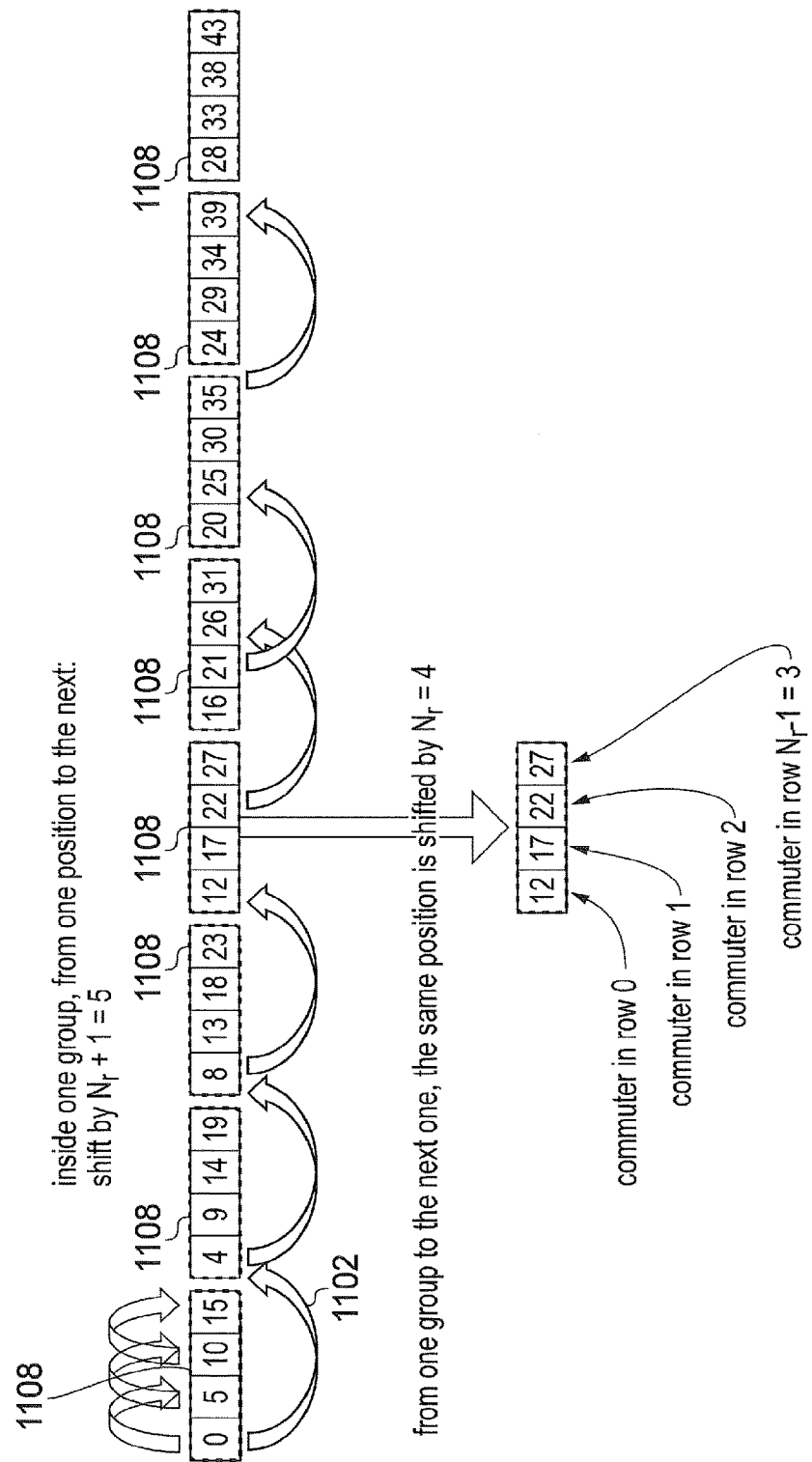
FIG. 11 is a schematic representation illustrating an effect of convolution interleaving in the transmitted symbol stream.

As shown in FIG. 11 the effect of the convolutional interleaver, for example, with the number of rows being $N_r$=4, is to map groups of input symbols into the output symbols stream in groups of 4 where in each group a displacement of each input symbol with respect to the output is equal to $N_r$+1. Therefore, as shown in FIG. 11 each of the groups of symbols 1108 have 4 symbols corresponding to the number of rows $N_r$ and each input symbol is displaced with respect to the corresponding position in the group for the next group as represented by the arrow 1102 by a number $N_r$. Furthermore, each input symbol is displaced with respect to its neighbouring symbol within the group by $N_r$+1.

Figure 12:
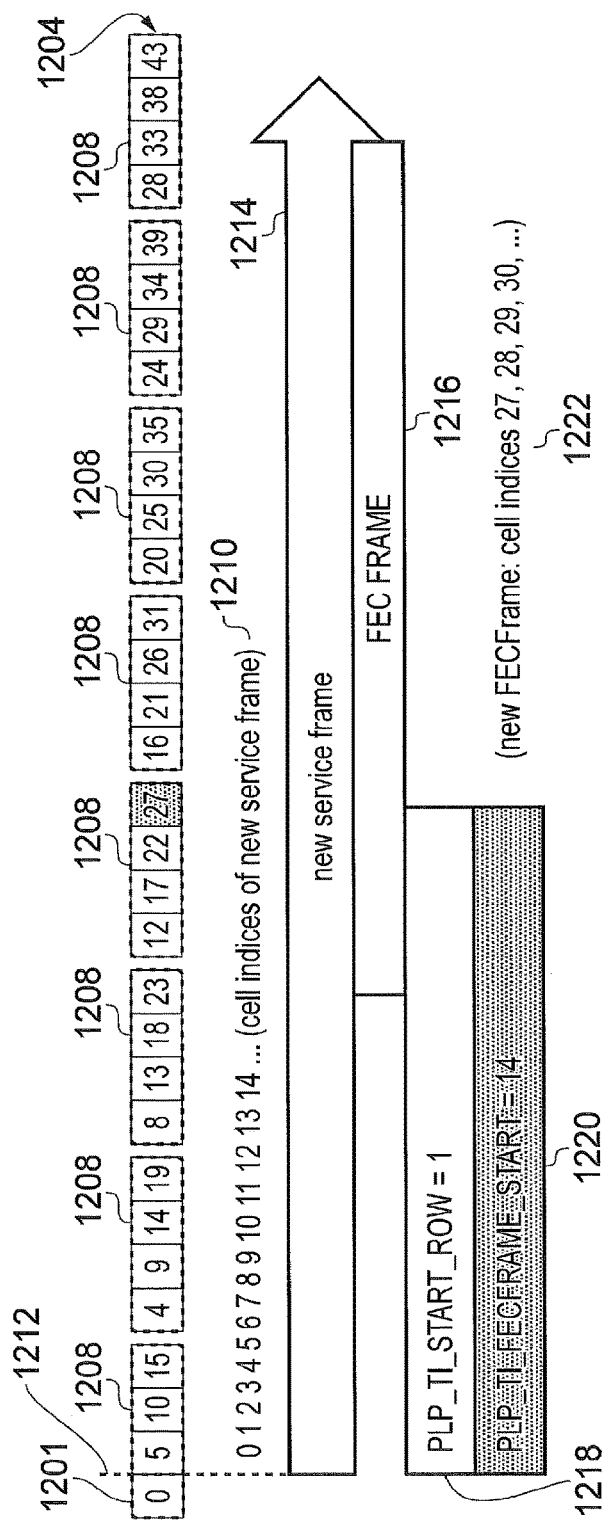
FIG. 12 is a schematic representation illustrating an effect of convolution interleaving in the transmitted symbol stream and an arrangement for performing convolutional deinterleaving between a new service frame and a first new error correction encoded frame in the new service frame.

A technical problem addressed by the present technique, which has been referred to above, will now be explained with reference to FIGS. 12 to 17. In FIG. 12 the presentation is given of a stream of received symbols, which is received at corresponding cell positions represented by the numbers within each of the boxes 1201 in the sequence of symbols or cells 1204. As for the example given in FIG. 11 the output signal stream is divided into groups of symbols 1208 each of which contains $N_r$=4 symbols. According to this representation the received symbol stream 1204 represents the sequence of symbols or cells which have been interleaved and are presented to the input of the deinterleaver 64 which could represent bits or symbols depending on whether the interleaving is performed at the symbol level or the bit level. As shown in FIG. 12 along side the received symbol stream 1204 is a sequence of numbers representing the cell indices numbering the sequential order of the received cells 1210. A dashed line 1212 indicates the start of a new service frame 1214. As for the example shown above the service frame 1214 could be an ATSC or a DVB frame representing a sequence of transmitted data cells providing a new time frame for a service data or a physical layer pipe (PLP). Thus, the new service frame 1214 is represented by an arrow which starts at position 1212. Furthermore, for the example shown in FIG. 12 the PLP start row 1218, which is the start of the new service frame 1214 corresponds to a position of the row 1 of the convolutional deinterleaver or interleaver. In other words, with regard to the numbering of the rows of the convolutional deinterleaver 64 shown in FIG. 10, the parameter PLP_TI_START_ROW shown in FIG. 12 identifies the row number of the convolutional deinterleaver from which the first cell or symbol of the new service frame is output.

As explained above within each service frame 1214 is transmitted a sequence of error correction encoded frames 1216, which will be referred to as forward error correction frames (FEC frames). Each of the FEC frames belongs to a physical layer pipe which is to be decoded by an error correction decoder 68 as shown in FIG. 8. Therefore, as shown in FIG. 12 a new service frame 1214 includes as part of that service frame many FEC frames 1216, which are to be decoded to recover part of the data of a physical layer pipe.

For the example shown in FIG. 12 the start row of the convolutional deinterleaver of the PLP is shown within box 1218 (PLP_TI_START_ROW) to be the first row that is row 1. Also for the example shown in FIG. 12, the first cell of the new service frame 1214 in which the first FEC frame 1216 starts is cell 14 and shown in box 1220 (PLP_TI_FEC-FRAME_START). Accordingly, in the received symbol stream 1204, that is before deinterleaving, the first cell number of the FEC frame is 27 and the subsequent cells in sequence are 28, 29 and 30 of the FEC frame 1216 as shown within brackets 1222. For this example, in which the start row of the new service frame for the first cell output by the convolutional deinterleaver is row 1 and the FEC frame starts at cell 14 of the new service frame, which is cell 27 of the received (interleaved) symbol stream, then within the interleaved symbol stream 1204 all of the subsequent cells carrying data cells of the FEC frame will occur within the new service frame, which is after the new service frame indicator 1212. However, this is not always the case, as will be explained with reference to FIG. 13.

Figure 13:
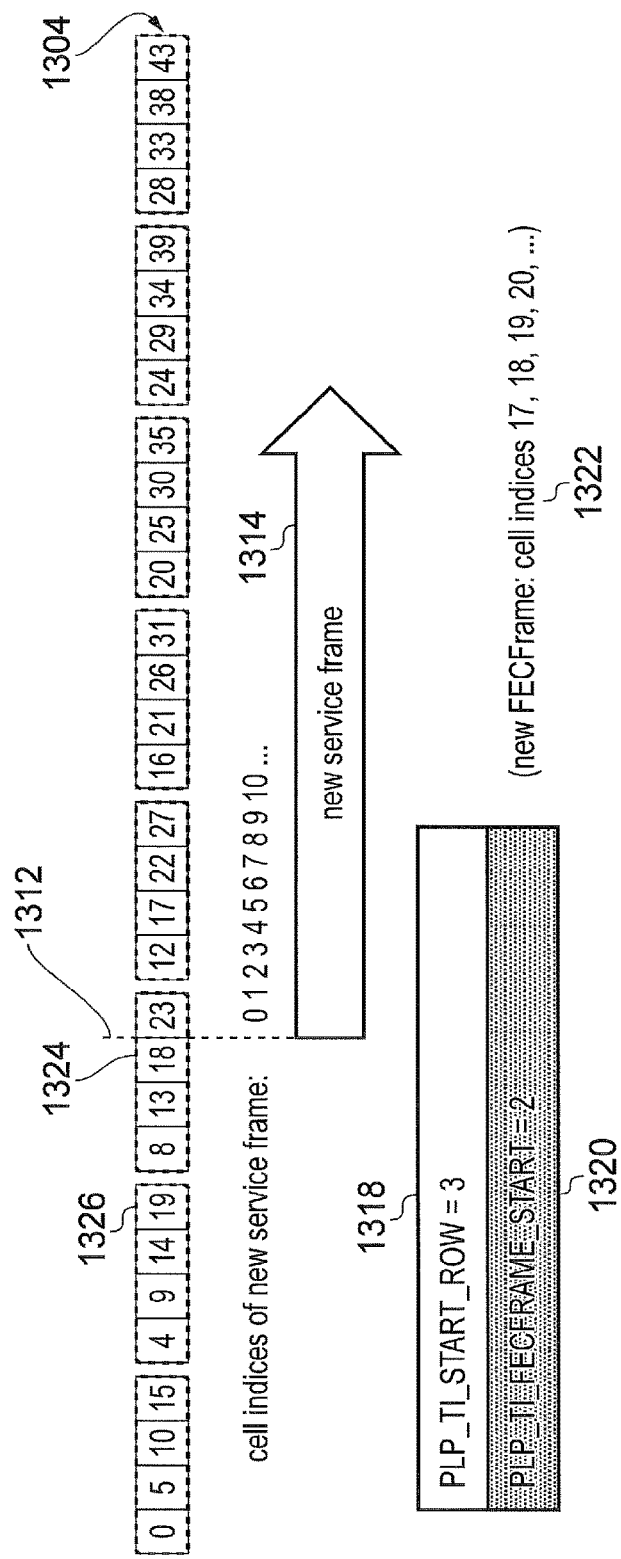
FIG. 13 is a schematic representation illustrating an effect of convolution interleaving in the transmitted symbol stream and an arrangement for performing convolutional deinterleaving between a new service frame and a first new error correction encoded frame in the new service frame, in which a technical problem is illustrated.

FIG. 13 corresponds to the examples shown in FIG. 12 except that there are different parameters for the interleaving and the start of the FEC frame within the new service frame 1314. As shown in FIG. 13 the new service frame 1314 starts at cell 23 in the interleaved received symbol stream 1304 after the start of new service frame indicator 1212. As shown in the boxes 1318, 1320 the PLP start row for this example is row 3 (PLP_TI_START_ROW=3) and the FEC frame start cell 1320 is cell 2 of the new service frame (PLP_TI_FECFRAME_START=2) so that as shown within the brackets 1322 the new FEC frame is provided from cells 17, 18, 19, 20 and onwards because start of the FEC frame occurred in cell 2 of the new service frame which comprises cell 17 and onwards in the interleaved received symbol stream 1304. However, there is a problem with the parameters according to this arrangement because cells 18 and 19 occur, in the received interleaved symbol stream before the start of the new service frame indicator 1312 in the previous service frame 1324, 1326. Therefore, if a receiver has been switched on in the previous service frame then the symbols 18 and 19 can not been received because the receiver could not have started receiving data until the new service frame 1312 has been detected. Accordingly, the error correction encoder would be unlikely to recover the FEC frame. Therefore it would be better not to decode this FEC frame in order to save on energy such as battery power or to signal to an application layer that this FEC frame has not been received (treated as an erasure), which may trigger a recovery process in which a previous frame is repeated.

Figure 14:
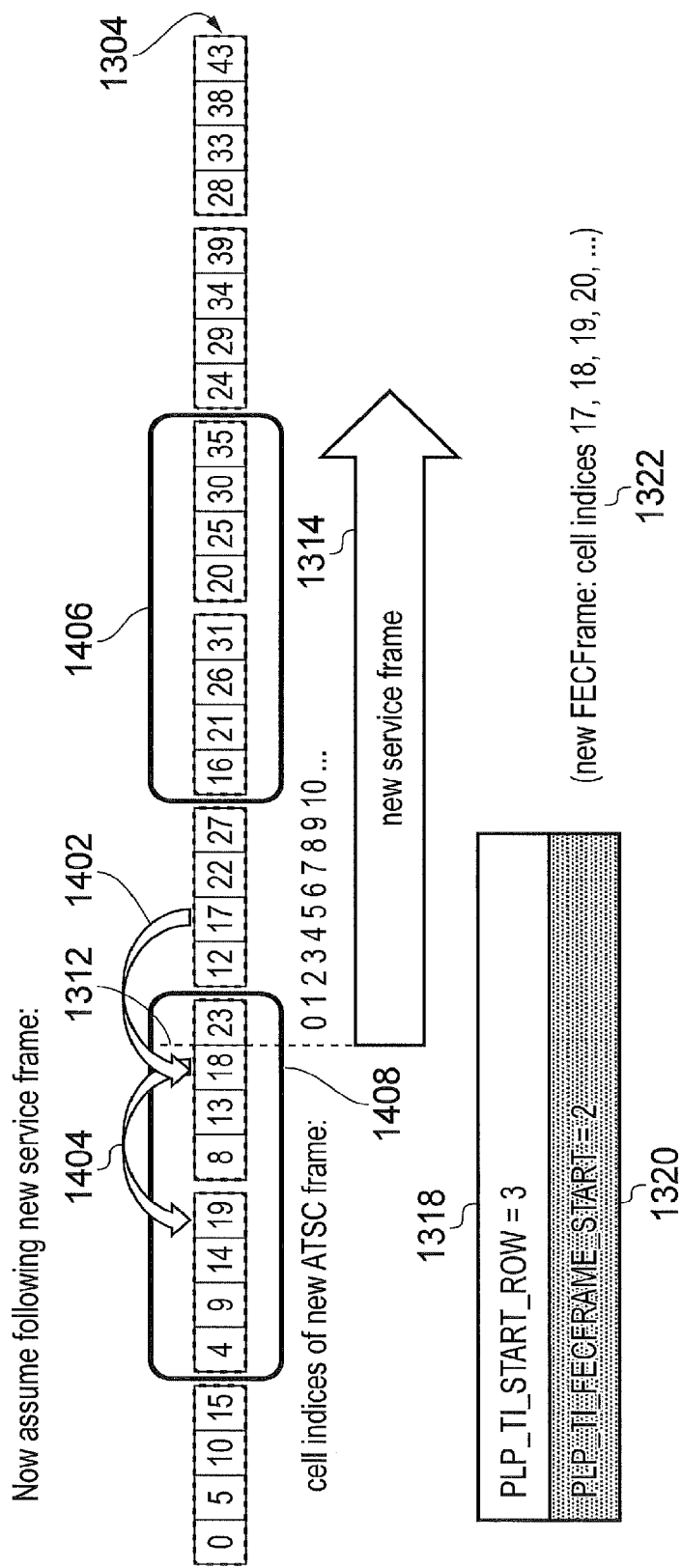
FIG. 14 is a schematic representation illustrating the technical problem illustrated in FIG. 13 of performing convolutional deinterleaving between a new service frame and the first new error correction encoded frame in the new service frame.

According to the present technique it is possible to calculate a safe distance value A with respect to which the first cell or symbol of the new FEC frame should be separated from the start of the new service frame 1314, as a function of the start row of the convolutional deinterleaver (PLP_TI_START_ROW) and the number of rows in the deinterleaver ($N_r$) as shown in FIG. 14. As can be seen in FIG. 14 because the start row of the convolutional deinterleaver is row 3 (PLP_TI_START_ROW=3), there are other symbols separated from the first cell recovered from the deinterleaver in previously transmitted cells such as shown in FIG. 14 by a distance 1402, 1404. Thus, as shown by boxes 1406, 1408 groups of cells or symbols in the received interleaved symbol stream 1304 contain symbols which makeup the first new FEC frame which was received within the new service frame 1314. As such, in order to detect whether the previous frame includes symbols of the first new FEC frame of the new service frame 1314, it is possible to determine as a function of the start row of the convolutional deinterleaver (PLP_TI_START_ROW) and the first cell within the new service frame of the first new FEC frame (PLP_TI_FECFRAME_START) a distance between the first cell of the new service frame and the cell within the service frame in which the first cell of the FEC frame is received, whether or not there are any data cells of the first new FEC frame in the interleaved received symbol stream, which have been transmitted in the previous service frame. Accordingly, a decoder can be de-activated so as to avoid trying to decode a first new FEC frame, thereby saving energy or signalling to a higher application layer that the FEC frame or the first new service frame cannot be recovered (erased frame).

Figure 15:
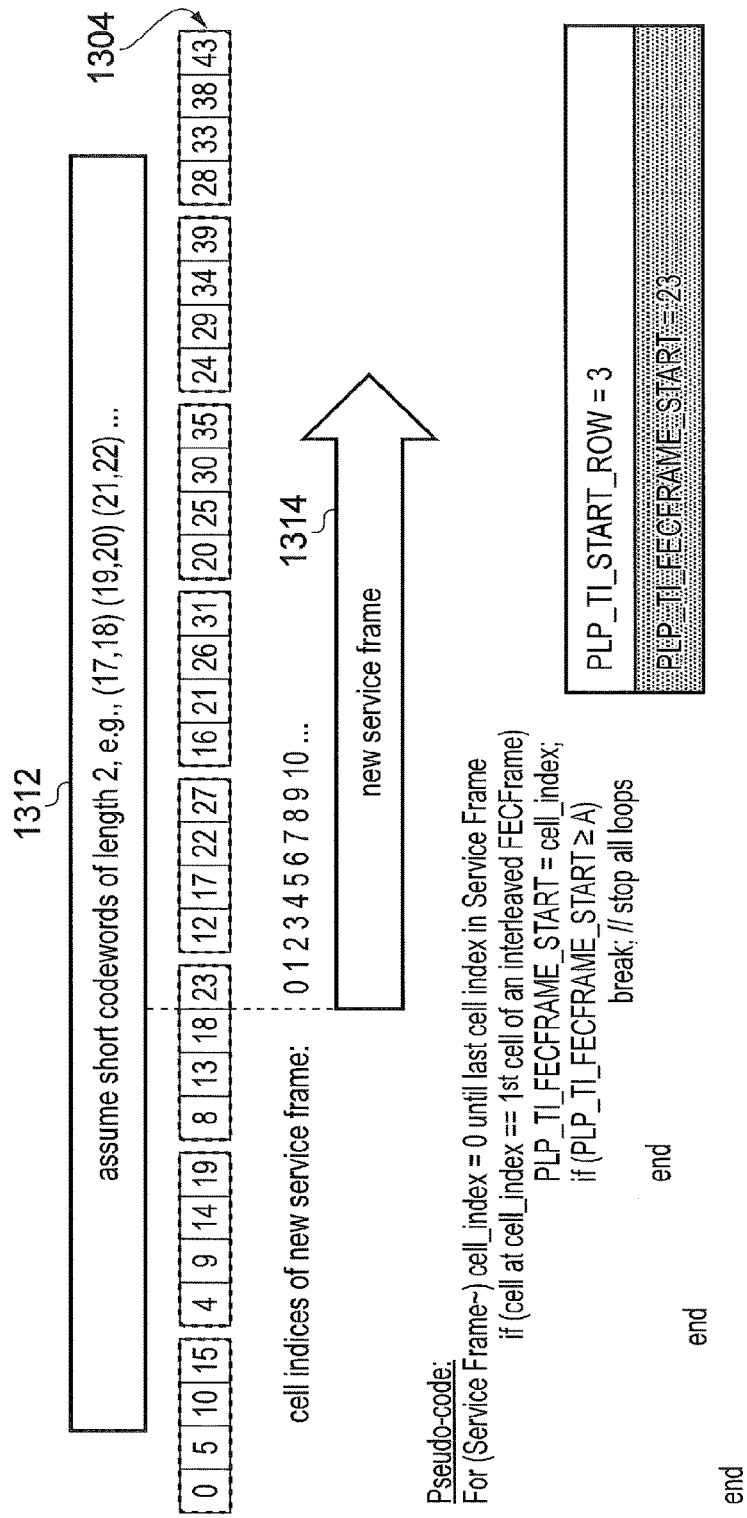
FIG. 15 is a schematic representation illustrating an effect of convolution interleaving in the transmitted symbol stream and an arrangement for performing convolutional deinterleaving between a new service frame and a first new error correction encoded frame in the new service frame, in which a technical solution is illustrated according to the present technique.

As shown in FIG. 15 according to the present technique a distance between the first cell of the FEC frame and the start of the new service frame is compared to a calculated safe distance value A, which is a function of the row of the interleaver in which the first cell of the new service frame is output. If the first cell of the FEC frame is greater than the distance A from the start of the new service frame, then the receiver can decode the FEC frame because none of the FEC frame cells were transmitted in the previous service frame. However, if there were cells transmitted in the previous service frame then the receiver cannot decode the FEC frame. This may apply to the first one of the FEC frames or one or more subsequent frames in the new service frame, because these may comprise cells which were transmitted in the previous service frame.

Transmitter Embodiment

According to some embodiments of the present technique, therefore, layer 1 signalling may be used to convey, amongst other parameters, the cell index of an FEC frame start symbol after the first cell index of the new service frame, which is in other words the position after the first cell index of the new service frame of a first symbol belonging to a FEC Frame, preferably one of the first FEC frames in this service frame. According to one example embodiment a transmitter is configured to determine the safe distance value A and to adjust the cell index of the first FEC frame after the first cell index of the new service frame to indicate to a receiver the first FEC frame which can be recovered entirely from the new service frame. To this end, the controller 210 in the encoding processor 22 shown in FIG. 3, for example, is configured to calculate the safe distance value A;

to identify the first cell of a first of the FEC frames, after the cell index of the first cell of the new service frame, which is more than a displacement A from the first cell of the new service frame;

to form the layer 1 signalling to be transmitted to the receiver to include the identified first cell of the first of the FEC frames of the service frame which can be decoded from cells received from the new service frame according to the two above steps.

According to this arrangement the transmitter is configured to adjust the signalling start frame of the first FEC frame, so that receivers, when detecting the first FEC frame can be sure to receive it completely after deinterleaving, thus to decode and to recover data from the FEC frame.

Receiver Embodiments

As an alternative arrangement, the transmitter may not transmit an indication of the first cell index of the first FEC frame after the first cell index of the new service frame, although the transmitter may in any case transmit, as part of the layer 1 signalling, the start row of the convolutional deinterleaver. However, the transmitter may not identify, if this first cell index is larger than the "safety distance value". For this example, embodiments of the present technique can provide an arrangement in which the receiver can perform a detection of whether the indicated first cell is within or outside the safe distance value.

According to the present technique, a receiver may therefore start with the first cell of a frame and inserts it to the convolutional deinterleaver in the start row, which has been identified from the layer 1 signalling. The receiver will then count until the cell index of the first cell or symbol of the FEC Frame. After this point the receiver can determine when symbols entered into the convolutional deinterleaver will leave the convolutional deinterleaver. This will be the beginning of a new FEC Frame, to be forwarded to the following parts of the receiver which are usually, a QAM demapper to demap the symbols to bits or soft bits (like LLRs—log likelihood ratios), followed by a bit deinterleaver, followed by a FEC decoder etc. However as mentioned above, the interleaved FEC Frame start-symbol may occur "too early" in the service frame, and as a result some of the cells of the FEC frame may have already been transmitted in the previous service frame. A receiver switching to this service (initial acquisition) will try to reconstruct this FEC frame after convolutional deinterleaving, but will not be able to receive it completely (missed the symbols from the previous frame). Its error correction decoder will run unnecessary processing steps or may even end up in an invalid state. As mentioned above for the transmitter embodiment, this problem does not occur because the signalled first cell index for the first FEC frame already includes an offset so that only the first FEC frame of the new service frame can be decoded.

With regard to the receiver embodiment, in which the offset for the safe distance value A has not been taken into account at the transmitter side, so that the signalled first FEC cell of the new start frame may be within the safe distance value A. Accordingly, embodiments of the present technique can provide a receiver, which detects a first cell of a first of the FEC frames which is outside the safe distance value A. This is done by a controller 310 shown in FIG. 16, which can calculate the safe distance value A. As explained above the value A represents the amount of cells in the interleaved sequence before the occurrence of a certain symbol, which needs to be collected, in order to guarantee that after de-interleaving, all following symbols to this particular symbols, are included as well. Thus, the cell index of a potential first symbol of a FEC frame after convolutional interleaving (cell index inside the service frame) must be larger or equal than A to guarantee that this FEC frame can be received completely.

Figure 16:
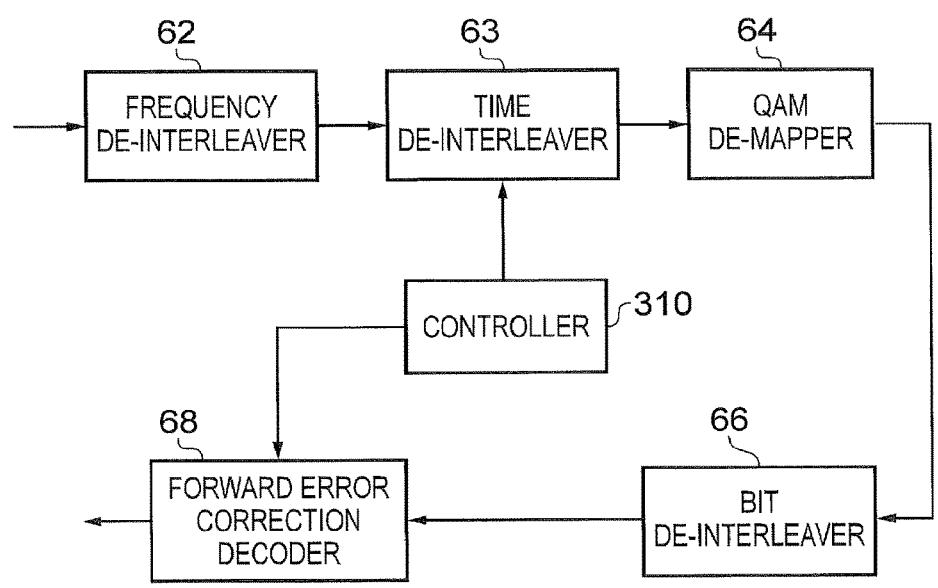
FIG. 16 is a schematic block diagram showing parts of the receiver shown in FIG. 4, which perform deinterleaving and error correction decoding and including a controller which is configured to control the error correction decoding in accordance with the present technique.

As shown in FIG. 16 parts of the receiver which are arranged to receive and decode the FEC frames in a service frame corresponding to the diagram shown in FIG. 8 includes the controller 310 which in accordance with the present technique serves to disable the FEC decoder 304 in accordance with received parameters in respect of the start of the FEC frame within the new service frame and the row of the interleaver in which the first cell of the FEC frame is output.

Figure 17:
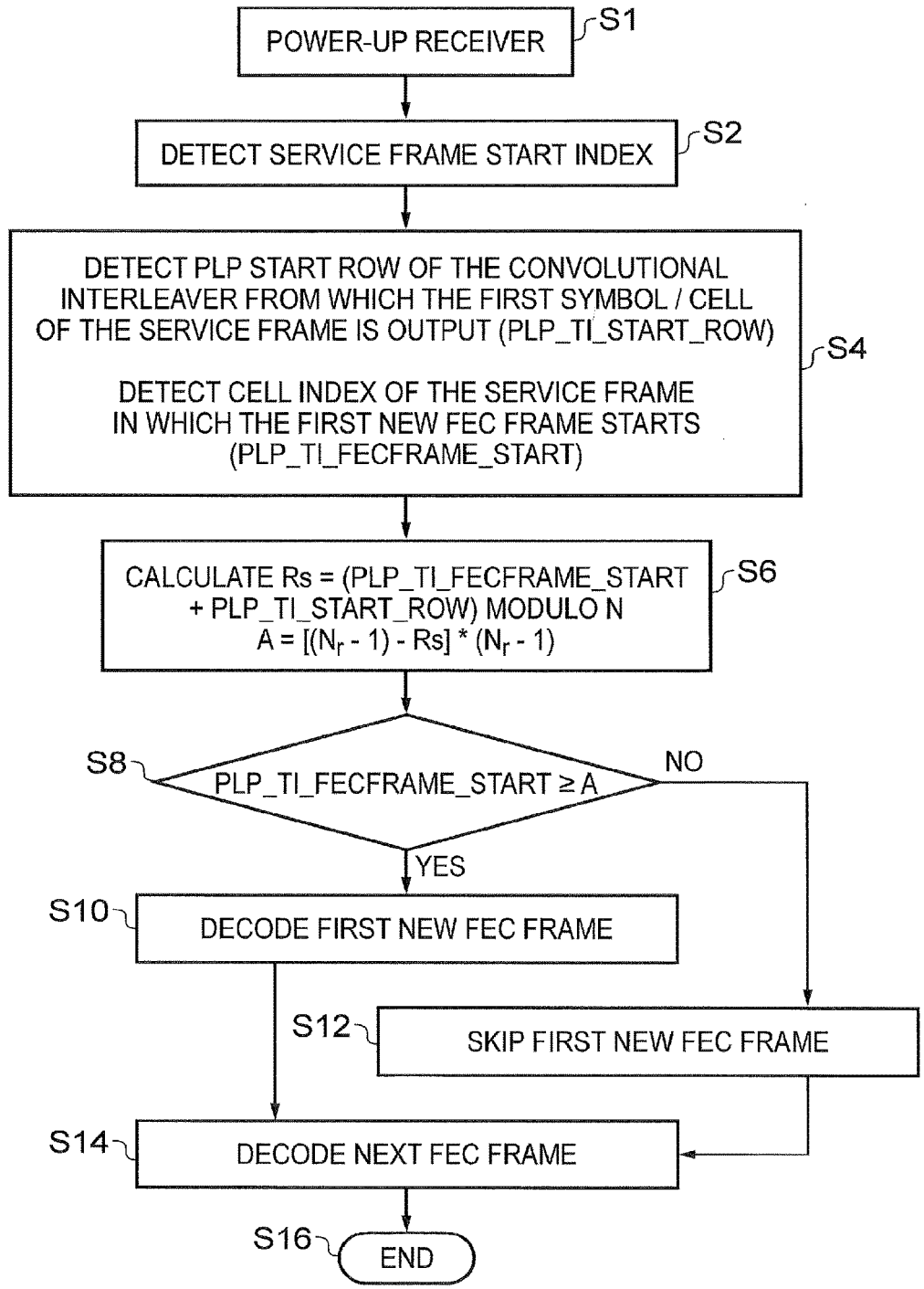
FIG. 17 is a flow diagram providing an example illustration of a method of controlling error correction decoding for data which has been convolutionally interleaved by the convolutional interleaver shown in FIG. 9 and in which a new service frame is being received in accordance with the present technique.

The operation of the controller 310, which forms part of a receiver in accordance with the present technique is presented in FIG. 17 which is summarised as follows:

S1. As a first step S1 the receiver is powered up or reset in some way or retunes or zapps to a new channel and therefore needs to recover a different PLP.

S2. In step S2 the receiver first detects the start of the new service frame index.

S4. The receiver then detects the start of the row of the convolutional interleaver in which the first cell or symbol of the service frame will be output (PLP_TI_STAR-T_ROW). The receiver also detects the cell index of the service frame in which the first or cell or symbol of the first new FEC frame starts in the service frame (PLP_TI_FECFRAME_START). In some examples, the position of the cell index of the service frame in which the new FEC frame starts is explicitly signalled to the received by the transmitter whereas in other examples the first cell of the FEC frame in the new service frame is detected in accordance with the pre-determined conditions, such as a specific number of cells or symbols from the start of the service frame. Signalling the PLP start row for the convolutional interleaver could be determined by ensuring that at the end of each service frame the interleaver finishes at a determined row of the interleaver. As explained below, in one example, the receiver decodes the L1-pre and post, configure the convolutional deinterleaver memory according to PLP_NUM_TI_ROWS. The controller then sets the commutators at row PLP_TI_STAR-T_ROW, before inserting the first data symbol of the current ATSC Frame.

S6. The receiver then calculates the distance A representing the safe distance from the start of the new service frame to the first symbol or cell in the service frame in which the first new FEC frame begins.

S8. The receiver then detects whether the FEC frame start cell or symbol in the new service frame, from the start of the new service frame is greater than or equal to the distance A. If is it not, then the FEC decoder 68 is reset by the controller 310 in that is does not attempt to decode the first new FEC frame of the service frame. If the FEC frame start cell is greater than the distance A with respect to the first new cell service frame then the decoder is allowed to proceed to decode the first new FEC frame. The controller 810 then writes the data cells into the convolutional deinterleaver. Note that in one example the convolutional deinterleaver resembles the convolutional interleaver structure from FIG. 9, except that the memory units constitute a lower-right triangle, compared with the upper-left triangle of the convolutional deinterleaver.

Effectively therefore the receiver is configured to forward the first complete FECFRAME to the next blocks at time $t+N_r*[(N_r-1)-Rs]$, where t is the time index, when PLP_TI_FECFRAME_START will enter the Rs-th row of the TDI. The delay until this symbol can be read out is thus $N_r*[(N_r-1)-Rs]$ for the FIG. 9 convolutional deinterleaver, although this expression changes to $R_s*N_r$ for the convolutional encoder of FIG. 19.

Figure 18:
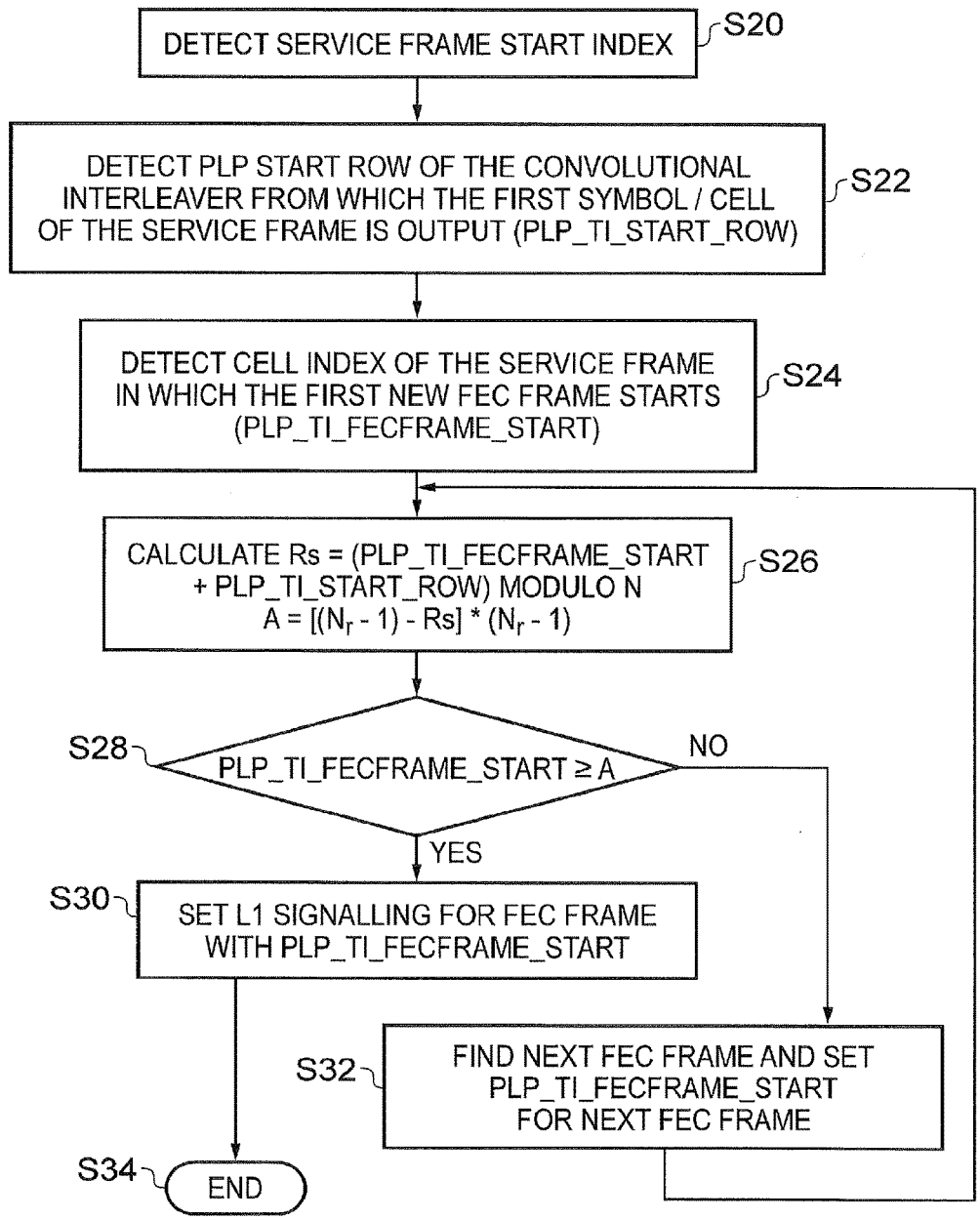
FIG. 18 is a flow diagram providing illustration of a method of transmitting data, including generating signalling data which indicates the first forward error correction encoded frame in a service frame, in which none of the data cells have been transmitted in a previous service frame when interleaved by the convolutional interleaver shown in FIG. 9.

In contrast the controller 210, which forms part of the encoder 22 in the transmitter may perform a process according to FIG. 18 in the transmitter which is summarised as follows:

S20. As a first step the transmitter detects the cell index in which the first cell of a FEC frame new service frame is to be transmitted.

S22. The start of the row or delay portion of the convolutional interleaver is detected, in which the first cell or symbol of the service frame was output (PLP_TI_STAR-T_ROW).

S24 The cell index of the service frame in which the first cell or symbol of the first new FEC frame starts is detected in the service frame (PLP_TI_FECFRAME_START). In some examples, the position of the cell index of the service frame in which the new FEC frame starts is detected from the output of the convolutional interleaver or detecting a delay through the convolutional interleaver for cells being interleaved from the first new FEC frame.

S26. The receiver then calculates the safe distance value or displacement value A representing the safe distance from the start of the new service frame to the first symbol or cell in the service frame in which the first new FEC frame begins.

S28. The receiver then determines at decision point S28, whether the FEC frame start cell or symbol in the new service frame, from the start of the new service frame is greater than or equal to the distance A. If is it not, then the processing proceeds to step S30, but if it is then processing proceeds to process step S30.

S30. If a displacement between the first cell of the new FEC frame after the first cell of the new service frame, and the first cell of the service frame exceeds the safe distance/displacement value A, then at step S30, the layer 1 signalling is arranged to include an indication of the first cell of the FEC frame for detection by the receiver.

S32. If the displacement between the first cell of the new FEC frame after the first cell of the new service frame, and the first cell of the service frame is less than the safe distance/displacement value A, then the next FEC frame is detected and the cell index of the first cell of the next FEC frame in the new service frame is identified. Processing then proceeds back to step S26 and the process steps S26, S28 and S32 repeated until the condition of the decision point S28 satisfied to reach S30.

S34. If step S30 has been executed then processing terminates in step S34.

Other Example Embodiments

As explained above, the present technique can be applied to any convolutional interleaver/de-interleaver to ensure that a synchronising receiver is able to detect and decode a FEC frame after tuning to a new channel. As will be appreciated therefore the order of the rows of the convolutional/de-interleaver can be inverted in the sense that the convolutional intereleaver presented above and illustrated in FIG. 9 is arranged with the row with the maximum delay in the first row and the row with no delay in the last row. However it will be appreciated that the first row could provide no delay, whereas the final row could provide the maximum delay. A corresponding arrangement could be provided for the convolutional dc-intereleaver. Such an alternative arrangement for a convolutional interleaver/de-interleaver is shown in FIG. 19. As shown in FIG. 19, effectively the structure of the interleaver and de-interleaver are reversed, with respect to the arrangement shown in FIG. 9. As such in the interleaver in FIG. 19, the first row has no delay, whereas the final row has the maximum number of delay elements 1504. As for the example shown in FIG. 9, the successively increasing number of delay elements 1504 are arranged to connect an input terminal connecting a commutator 1501 which successively rotates as represented by the arrow 1506. Output connectors 1503 connect the input terminals via the delay elements 1504 to output terminals, which are connected by an output commutator 1502.

Correspondingly the de-interleaver 206 shown in FIG. 19 is provided with an input commutator 1501, which is arranged to connect input terminals via rows with successively decreasing numbers of delay elements 1504 to output terminals provided by connectors 1503. At the output, an output commutator 1502 connects the output terminals successively as represented by arrow 1506.

In accordance with the present technique, for an example embodiment in which a first row of the interleaver 63 has no delay elements 1504 and the final row has the maximum number of delay elements, then the calculation of the a controller in the transmitter is changed in order to provide a displacement value (A) representing a minimum displacement from the first cell of the service frame of a first cell of a first of the forward error correction frames, for which none of the data cells of the forward error correction frame will be transmitted in one or more previous service frames. According to the present technique, the calculation of the displacement value A for the convolutional interleaver/de-interleaver shown in FIG. 19 changes to be: $A=R_s*(N_r+1)$ whereas with the corresponding expression for the convolutional interleaver/de-interleaver shown in FIG. 9, $N_r$ is the number of delay portions, and $R_s$, as for the FIG. 9 convolutional interleaver/de-interleaver, is calculated in accordance with $R_s=(PLP\_TI\_FECFRAME\_START+PLP\_TI\_START\_ROW) \pmod{N_r}$ where PLP_TI_FECFRAME_START is the number of service frame data cells of the new service frame after which the first data symbol of the first forward error correction frame is read and PLP_TI_START_ROW is the delay portion from which the first service frame data symbol of the new service frame is read.

Figure 20:
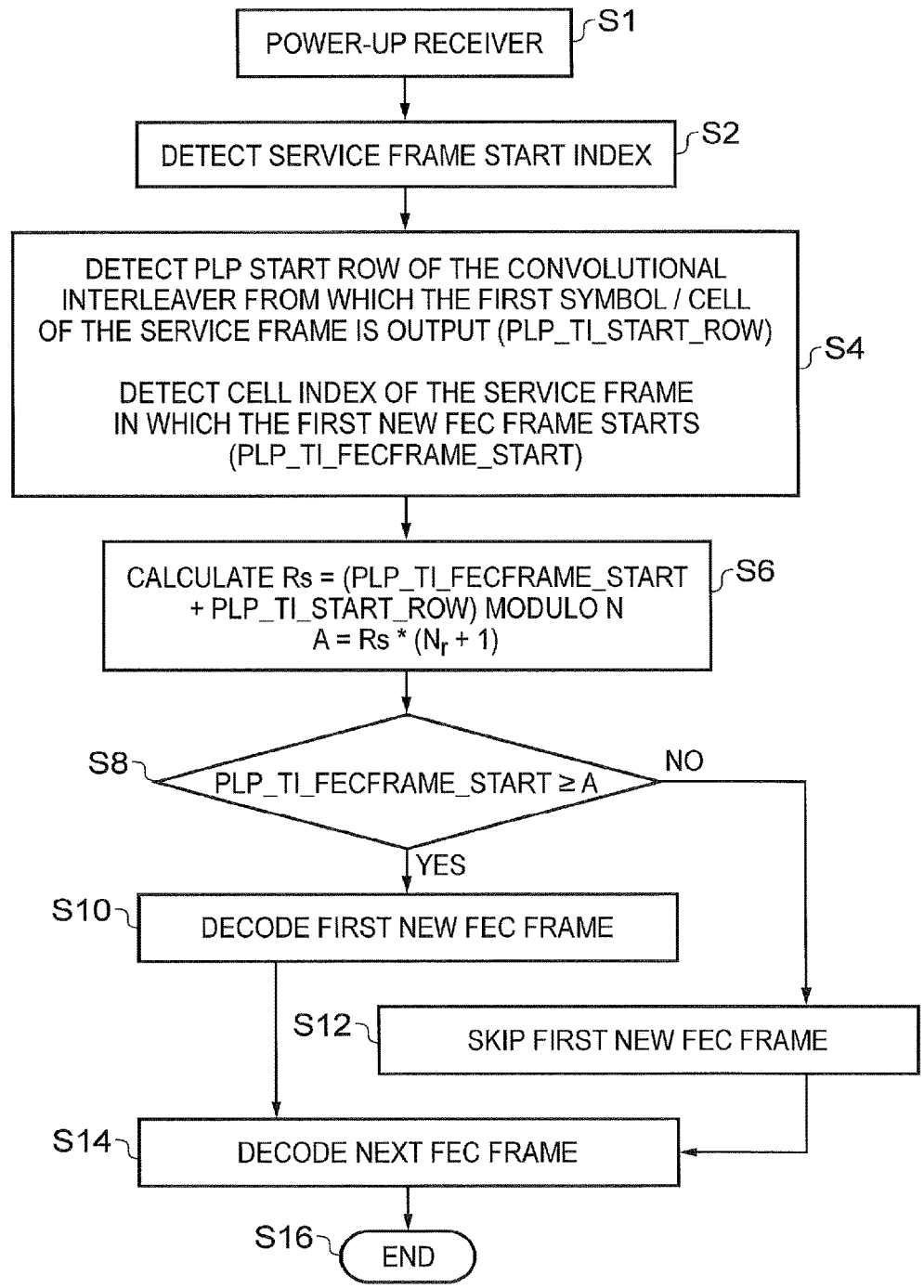
FIG. 20 is a flow diagram providing an example illustration of a method of controlling error correction decoding for data which has been convolutionally interleaved for the example of the convolutional deinterleaver shown in FIG. 19 in accordance with the present technique.
Figure 21:
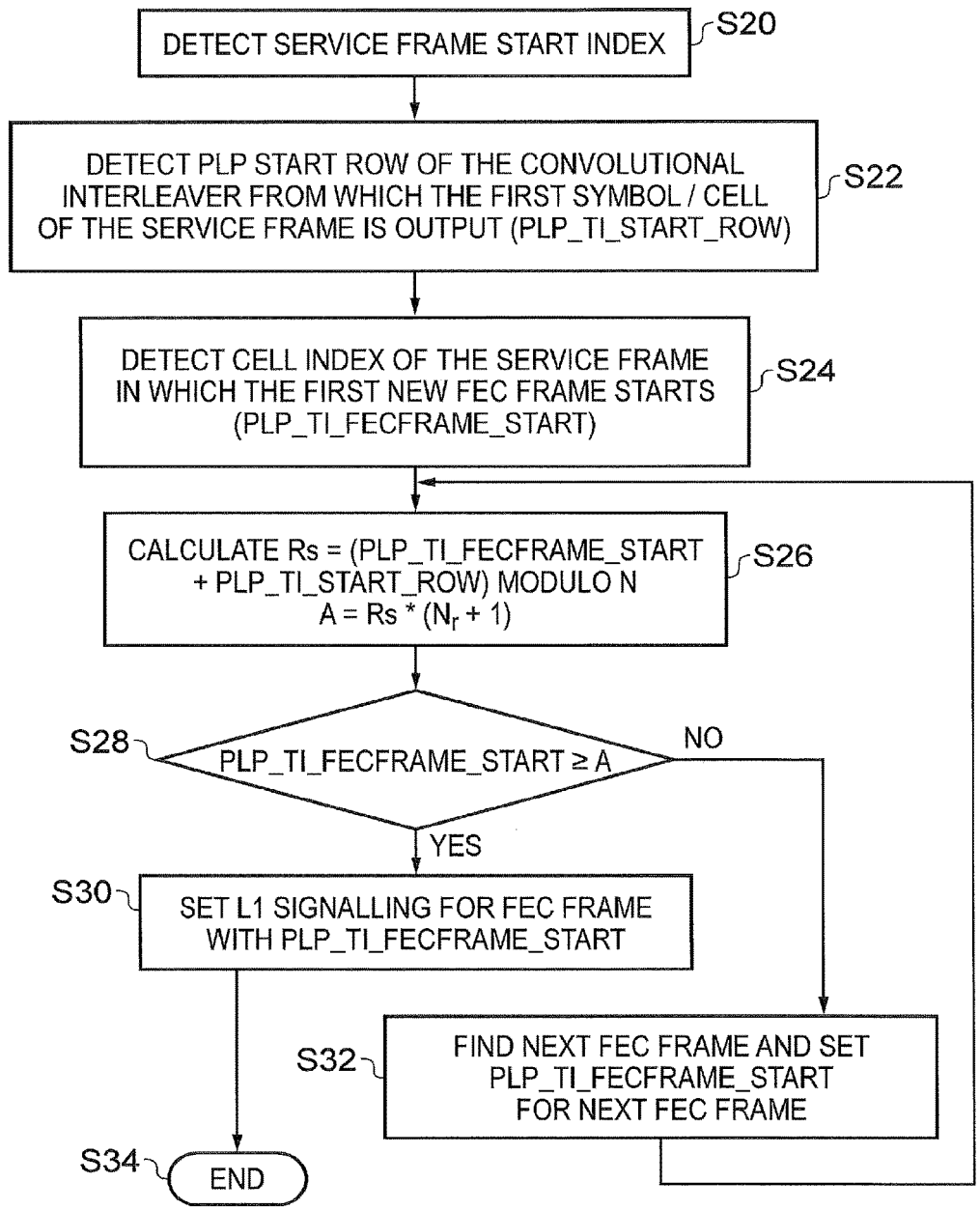
FIG. 21 is a flow diagram providing illustration of a method of transmitting data, including generating signalling data which indicates the first forward error correction encoded frame in a service frame, in which none of the data cells have been transmitted in a previous service frame for the example convolutional interleaver shown in FIG. 19.

The operation of a receiver in accordance with the present technique for an example of a convolutional interleaver/de-interleaver shown in FIG. 19 is as shown in FIG. 20. Correspondingly the operation of a transmitter embodying the present technique for the example of the convolutional interleaver/de-interleaver of FIG. 19 is shown in FIG. 21. As will be appreciated from the above explanation, the only difference between the operations presented in FIGS. 20 and 21 for a respective receiver and a transmitter according to the present technique, which uses a convolutional interleaver/de-interleaver of FIG. 19 from the operations of the respective receiver and transmitter shown in FIGS. 17 and 18 for the convolutional interleaver/de-interleaver of FIG. 9 concerns the calculation of the displacement value A, which changes to the expression presented above. Accordingly, the only difference between the flow diagram presented in FIG. 20 to that of FIG. 17 is in process step S6, which changes to the abovementioned expression, with $A=R_s*(N_r+1)$. Similarly the only difference between the operation of the transmitter between the flow diagrams presented in FIGS. 18 and 21 is process step S26, which has also changed to the same expression for the displacement value A.

Signalling Parameters for Time Interleaving for Single PLP for the Example Embodiment According to FIG. 19

The following paragraphs provide some example illustrations for parameters which may be used in example applications of the present technique.

L1-Detail Time Interleaver (TI) Parameters

The following signalling parameters may be used to signal the use and parameters for convolutional time interleaver for a given PLP:

L1D_plp_TI_extended_interleaving: This flag shall indicate whether extended interleaving is to be used for this PLP. A value of 1 shall indicate that extended interleaving is used. A value of 0 shall indicate that extended interleaving is not used. A value of 1 shall only be selected when the modulation of the PLP is QPSK. A value of 1 shall not be selected when LDM is used.

Convolutional Time Interleaver Mode Parameters

The following parameters shall indicate the configuration of the convolutional time interleaver in CTI mode.

L1D_CTI_depth: This field shall indicate the number of rows used in the convolutional time interleaver, including the row without any delay. L1D_CTI_depth shall be signaled according to the Table below:

TABLE

Signaling format for L1D_CTI_depth

| Value | Number of Rows |
|---|---|
| 000 | 1 (no time interleaving in CTI mode) |
| 001 | Reserved for future use |
| 010 | Reserved for future use |
| 011 | 512 |
| 100 | 724 |

TABLE-continued

Signaling format for L1D_CTI_depth

| Value | Number of Rows |
|---|---|
| 101 | 887 or 1254 (extended interleaving) |
| 110 | 1024, or 1448 (extended interleaving) |
| 111 | Reserved for future use |

L1D_CTI_start_row: This field shall indicate the position of the interleaver selector at the start of the subframe.

L1D_CTI_fecframe_start: This field shall indicate the start position of the first complete FEC frame in the subframe. The start position is the index of the first cell in the FEC frame. In order to signal only FEC frames which will begin in the current subframe, the following condition shall be fulfilled L1D_CTI_fecframe_start≥Rs·(Nrows+1), where Rs is the row index for the L1D_CTI_fecframe_start-th cell inside the subframe and is defined as Rs:= (L1D_CTI_fecframe_start+L1D_CTI_start_row) modulo Nrows. If the start position of a FEC frame does not fulfil the above condition, that is if cells belonging to the same FEC frame appear also in previously transmitted subframes (due to the delaying nature of the convolutional time interleaver) the next FEC frame start position shall be checked and used if it meets the conditions, and so on until a FEC frame which meet the conditions is found. When LDM is used, this field shall be signaled for both core layer and enhanced layer PLPs since the start positions of the first complete FEC frames of core-layer and enhanced-layer PLPs that have been layered division multiplexed together are in general different.

L1D_CI_fecframe_start: This field shall indicate the start position of the first complete FEC frame, leaving the CTI in the current or subsequent subframes. The position counts the number of cells from current subframe start and is computed as follows:

Detect the first FEC flame entering the CTI after the subframe start. Denote the cell position as k0 (e.g., k0=3 indicates a FEC frame enters the CTI after 3 cells, starting counting from 0 from current subframe start).

Then L1D_CI_fecframe_start=k0+$R_s$*Nrows, where Rs:=(k0+L1D_CI_start_row) modulo Nrows is the row index for this FEC frame.

The counter L1D_CI_fecframe_start may exceed subframe boundaries.

As an alternative embodiment, for a single PLP (S-PLP), several signalling parameters may be changed, compared with the case of multiple PLPs (M-PLP) case, due to two differences: a) different interleaver structure, b) no need to signal parameters, which are needed for M-PLP. These differences in signalling parameters will be explained in the following paragraphs in more detail:

a) Signalling Parameters for Convolutional Interleaver

The main parameter to configure the TI for S-PLP is the number of rows $N_{rows}$, which has been called $N_r$ previously. This will be signaled in the configurable L1-post part as follows:

PLP_NUM_TI_ROWS—This 2-bit field shall indicate the number of rows used in the time de-interleaver including the row without any delay. PLP_NUM_TI_ROWS shall be signalled according to the table below:

Signalling Format for the PLP_NUM_TI_ROWS Field

| Value | number of rows $N_{rows}$ |
|---|---|
| 00 | 1024 |
| 01 | 887 |
| 10 | 724 |
| 11 | 512 |

For initial acquisition, the receiver needs to know the following two parameters, which are signaled in the dynamic L1-post part.

PLP_TI_START_ROW—This 11-bit field shall indicate the position of the (de-)interleaver commutator at the start of the ATSC Frame.

PLP_TI_FECFRAME_START—This 15-bit field shall indicate the start position of the first complete FECFRAME in the ATSC Frame. The start position is the cell index inside the ATSC Frame. In order to signal only FECFRAMEs, which will appear completely in the current or upcoming ATSC Frames, the following condition needs to be fulfilled:

PLP_TI_FECFRAME_START≥$R_s$·($N_{rows}$+1) (for the FIG. 19 convolutional interleaver/deinterleaver, or for the FIG. 9 convolutional interleaver/de-interleaver then≥[($N_r$−1)−Rs]*($N_r$−1)), where $R_s$:=(PLP_TI_FECFRAME_START+PLP_TI_START_ROW) modulo $N_{rows}$ is the row index for the PLP_TI_FECFRAME_START-th cell inside the ATSC frame. If the start position of a FECFRAME does not fulfil the above condition, i.e., if cells belonging to the same FECFRAME appear also in previously transmitted ATSC Frames due to the delaying nature of the convolutional interleaver, the next FECFRAME start position shall be checked and so on.

The time de-interleaver (TDI) at the receiver will thus perform the following steps at initial acquisition:

Decode L1-pre and post, configure the TDI memory according to PLP_NUM_TI_ROWS

Set the commutators at row PLP_TI_START_ROW, before inserting the first data symbol of the current ATSC Frame Write the data cells to the TDI. Note that the TDI resembles the TI structure from FIG. 19, except that the memory units constitute an upper-left triangle, compared with the lower-left triangle of the TI.

Forward the first complete FECFRAME to the next blocks at time t+$N_{rows}$·$R_s$, where t is the time index, when PLP_TI_FECFRAME_START will enter the $R_s$-th row of the TDI. The delay until this symbol can be read out is thus $N_{rows}$·$R_s$.

b) Limited Parameters for S-PLP Case

The following parameters from dynamic L1-post shall not be signalled for S-PLP to reduce the overhead, since they do not apply to the S-PLP case:

SUB_SLICES_PER_FRAME, SUB_SLICES_INTERVAL, TYPE_2_START—apply only to Type 2 PLPs of M-PLP case PLP_START—Each ATSC frame will immediately start with data PLP.

PLP_NUM_BLOCKS—For a sheer convolutional interleaver, there is no need to have an integer number of FECFRAMEs per ATSC Frame. Instead, the complete frame capacity shall be used to transmit an arbitrary number of data cells of the S-PLP. This avoids the need to insert dummy cells at the end of each ATSC Frame and thus significantly reduces the overhead.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

The following numbered paragraphs provide further example aspects and features of the present disclosure:

Paragraph 1. A transmitter for transmitting data, the transmitter comprising a forward error correction encoder configured to encode the data to form forward error correction encoded frames of encoded data cells, a service frame builder configured to form a service frame for transmission comprising a plurality of the forward error correction encoded frames, a convolutional interleaver comprising a plurality of delay portions and configured to convolutionally interleave the encoded data cells of the plurality of the forward error correction encoded frames of the service frames, a modulation symbol mapper configured to map the interleaved and encoded data cells of the service frames onto modulation cells, and a modulator configured to modulate one or more carriers with the modulation cells for transmission, and a controller configured to form signalling data to be transmitted with the service frames to include an indication of an identified first of the encoded data cells of a first of the plurality of forward error correction encoded frames of a service frame which can be decoded from encoded data cells received from the service frame or the service frame and one or more other service frames following after the service frame.

Paragraph 2. A transmitter according to paragraph 1, wherein the controller is configured to calculate a displacement value (A) representing a minimum displacement from the first of the encoded data cells of the service frame to a first encoded data cell of a first of the forward error correction frames, for which none of the encoded data cells of the forward error correction frame will be transmitted in one or more previous service frames, and to form the indication of the identified first encoded data cell from the first cell of the service frame providing a first of the forward error correction encoded frames in the service frame which has a encoded data cell index equal to or after the calculated displacement value.

Paragraph 3. A transmitter according to paragraph 2, wherein the controller is configured to detect the service frame, to detect from which of the plurality of delay portions of the convolutional interleaver circuitry a first encoded data cell of the service frame is read, to calculate the displacement value (A) based upon the detected service frame and the delay portion from which the first encoded data cell of the service frame is read, to identify the first encoded data cell of a first of the forward error correction frames, after the encoded data cell index of the first encoded data cell of the service frame, which is more than the displacement value (A) from the first encoded data cell of the service frame; and to form the signalling data with the indication of the first encoded data cell of the first of the forward error correction encoded frames of the service frame which can be decoded from encoded data cells received from the service frame.

Paragraph 4. A transmitter according to paragraph 2 or 3, wherein each of the plurality of delay portions of the convolutional interleaver is arranged to delay the encoded data cells from an input to an output by a different amount, the delay portions being arranged in a sequence, the convolutional interleaver comprising an input commutator configured to input the encoded data cells to the delay portions so that successive data cells are input in accordance with the sequence of the delay portions, and an output commutator configured to read the encoded data cells from the delay portions by successively selecting the data cells from the outputs of the delay portions in accordance with the sequence of the delay portions to form the interleaved and forward error correction encoded data cells.

Paragraph 5. A transmitter according to paragraph 4, wherein the displacement value A is based on a multiplication of a factor $R_s$ by the number of delay portions $N_r$, where $$R_s=(PLP\_TI\_FECFRAME\_START+PLP\_TI\_START\_ROW)(mod\ N_r)$$

and where PLP_TI_FECFRAME_START is the number of service frame data cells of the new service frame after which the first data symbol of the first forward error correction frame is read and PLP_TI_START_ROW is the delay portion from which the first service frame data symbol of the new service frame is read.

Paragraph 6. A transmitter according to paragraph 5, wherein a first of the plurality of delay portions of the sequence of the convolutional interleaver is arranged to delay the encoded data cells from the input to the output by the greatest amount compared to the other delay portions in the sequence, and a last of the delay portions in the sequence is arranged to delay the encoded data cells by the least amount, and the displacement value A is calculated in accordance with $A=((N_r-1)-R_s)*(N_r-1)$.

Paragraph 7. A transmitter according to paragraph 5, wherein a first of the plurality of delay portions of the sequence of the convolutional interleaver is arranged to delay the encoded data cells from the input to the output by the least amount compared to the other delay portions in the sequence, and a last of the delay portions in the sequence is arranged to delay the encoded data cells by the greatest amount, and the displacement value A is calculated in accordance with $A=R_s*(N_r+1)$.

Paragraph 8. A transmitter according to paragraph 5, 6 or 7, wherein controller is configured to form the layer 1 signalling data to include PLP_TI_FECFRAME_START and PLP_TI_START_ROW.

Paragraph 9. A transmitter according to any of paragraphs 1 to 8, wherein each of the delay portions includes one or more memory elements and the controller is configured to set the initial content of the memory elements of the interleaver before inputting the encoded data cells with predetermined values.

Paragraph 10. A transmitter according to paragraph 9, wherein the predetermined values include symbols derived from a constant amplitude zero auto-correlation, CAZAC, sequence.

Paragraph 11. A transmitter according to any of paragraphs 1 to 10, wherein the number of memory elements is $N_r \cdot (N_r-1)/2$, where $N_r$ is the number of rows of the convolutional interleaver.

Paragraph 12. A method of transmitting data, the method comprising encoding the data to form forward error correction encoded frames of encoded data cells, forming a service frame for transmission comprising a plurality of the forward error correction encoded frames, convolutionally interleaving the encoded data cells of the plurality of the forward error correction encoded frames of the service frames using a convolutional interleaver comprising a plurality of delay portions, mapping the interleaved and encoded data cells of the service frames onto modulation cells, modulating one or more carriers with the modulation cells for transmission, and forming signalling data to be transmitted with the service frames to a receiver to include an indication of an identified first of the encoded data cells of a first of the plurality of forward error correction encoded frames of a service frame which can be decoded from encoded data cells received from the service frame or the service frame and one or more other service frames following after the service frame.

Paragraph 13. A method according to paragraph 12, wherein the forming the signalling data comprises calculating a displacement value (A) representing a minimum displacement from a first of the encoded data cells of the service frame to a first encoded data cell of a first of the forward error correction frames, for which none of the encoded data cells of the forward error correction frame will be transmitted in one or more previous service frames; and forming the indication of the identified first encoded data cell from the first cell of the service frame providing a first of the error correction encoded frames in the service frame which has a encoded data cell index equal to or after the calculated displacement value.

Paragraph 14. A method according to paragraph 13, wherein the calculating the displacement value (A) comprises detecting the service frame, detecting from which of the plurality of delay portions of the convolutional interleaver circuitry a first encoded data cell of the service frame is read, calculating the displacement value (A) based upon the detected service frame and the delay portion from which the first encoded data cell of the service frame is read, identifying the first encoded data cell of a first of the forward error correction frames, after the encoded data cell index of the first encoded data cell of the service frame, which is more than the displacement value (A) from the first encoded data cell of the service frame, and forming the signalling data with the indication of the first encoded data cell of the first of the forward error correction encoded frames of the service frame which can be decoded from encoded data cells received from the service frame.

Paragraph 15. A method according to paragraph 12, 13 or 14, wherein each of the plurality of delay portions of the convolutional interleaver is arranged to delay the encoded data cells from an input to an output by a different amount, the delay portions being arranged in a sequence, the convolutional interleaving comprising inputting the encoded data cells to the delay portions so that successive data cells are input in accordance with the sequence of the delay portions, and reading the encoded data cells from the delay portions by successively selecting the data cells from the outputs of the delay portions in accordance with the sequence of the delay portions to form the interleaved and forward error correction encoded data cells.

Paragraph 16. A method according to paragraph 15, wherein the displacement value A is based on a multiplication of a factor $R_s$ by the number of delay portions $N_r$, where $$R_s = (PLP\_TI\_FECFRAME\_START + PLP\_TI\_START\_ROW)(\bmod N_r)$$

and where PLP_TI_FECFRAME_START is the number of service frame data cells of the new service frame after which the first data symbol of the first forward error correction frame is read and PLP_TI_START_ROW is the delay portion from which the first service frame data symbol of the new service frame is read.

Paragraph 17. A method according to paragraph 16, wherein a first of the plurality of delay portions of the sequence is arranged to delay the encoded data cells from the input to the output by the greatest amount compared to the other delay portions in the sequence, and a last of the delay portions in the sequence is arranged to delay the encoded data cells by the least amount, and the displacement value A is calculated in accordance with $A = ((N_r-1)-R_s)*(N_r-1)$.

Paragraph 18. A method according to paragraph 16, wherein a first of the plurality of delay portions of the sequence is arranged to delay the encoded data cells from the input to the output by the least amount compared to the other delay portions in the sequence, and a last of the delay portions in the sequence is arranged to delay the encoded data cells by the greatest amount, and the displacement value A is calculated in accordance with $A = R_s*(N_r+1)$.

Paragraph 19. A method according to paragraph 16, 17 or 18, wherein the forming the layer 1 signalling data includes forming the layer 1 signalling data to include PLP_TI_FECFRAME_START and PLP_TI_START_ROW.

Paragraph 20. A method according to any of paragraphs 12 to 19, wherein each of the delay portions includes one or more memory elements and the method comprises setting the initial content of the memory elements of the interleaver, before inputting the encoded data cells, with predetermined values.

Paragraph 21. A method according to paragraph 20, wherein the predetermined values include symbols derived from a constant amplitude zero auto-correlation, CAZAC, sequence.

Paragraph 22. A method according to any of paragraphs 12 to 21, wherein the number of memory elements is $N_r \cdot (N_r-1)/2$, where $N_r$ is the number of rows of the convolutional interleaver.

Paragraph 23. A receiver for recovering data symbols from a received signal, the receiver comprising a demodulator configured to detect the received signal comprising a convolutionally interleaved symbol stream comprising a sequence of service frames, each service frame including one or more forward error correction encoded frames of encoded data cells, convolutional deinterleaver circuitry comprising a plurality of delay portions and configured to convolutionally deinterleave the received encoded data cells, a forward error correction decoder configured to decode the encoded frames of encoded data cells, and controller circuitry configured to detect a service frame, to detect from which of the plurality of delay portions of the convolutional deinterleaver circuitry a first encoded data cell of a service frame is read, to detect the number of the service frame encoded data cells of the service frame after which a first forward error correction frame is read, and to detect, based upon the detected service frame, the delay portion from which a first encoded data cell of the service frame is read, and the number of the service frame encoded data cells of the service frame after which a first encoded data cell of one of more of the forward error correction frames is read, whether any encoded data cells of the one or more forward error correction frames were transmitted in a previous service frame, and if any of the encoded data cells of the one or more of the forward error correction frames were transmitted in a previous service frame not received by the receiver, not to decode the forward error correction frame, or if no encoded data cells of one or more of the forward error correction frame were transmitted in the previous service frame, or if any encoded data cells of the new forward error correction frame were transmitted in a received previous service frame, to decode the forward error correction frames to recover the stream if data symbols.

Paragraph 24. A receiver according to paragraph 23, wherein the receiver is configured to switch to detect the received signal during the previous service frame.

Paragraph 25. A receiver according to paragraph 23 or 24, wherein the number of encoded data cells of the service frame after which a first encoded data cell of the first forward error correction frames of the service frame can be read in order for a first of the forward error correction frames to be decoded is greater than or equal to a displacement value A determined in accordance with the start row of the convolutional deinterleaver and the number of rows in the deinterleaver.

Paragraph 26. A receiver according to paragraphs 23, 24 or 25, wherein each of the plurality of delay portions of the convolutional deinterleaver is arranged to delay symbols from the symbol stream from an input to an output by a different amount, the delay portions being arranged in a sequence, the convolutional deinterleaver comprising an input commutator configured to input the encoded data cells to the delay portions so that successive encoded data cells are input in accordance with the sequence of the delay portions, and an output commutator configured to read the symbols from the delay portions by successively selecting the encoded data cells from the outputs of the delay portions in accordance with the sequence of the delay portions to form a deinterleaved stream of encoded data cells from the received interleaved stream of encoded data cells.

Paragraph 27. A receiver as claimed in claim 26, wherein the displacement value A is based on a multiplication of a factor $R_s$ by the number of delay portions $N_r$, where $$R_s = (PLP\_TI\_FECFRAME\_START + PLP\_TI\_START\_ROW)(\mod N_r)$$

and where PLP_TI_FECFRAME_START is the number of service frame data cells of the new service frame after which the first data symbol of the first forward error correction frame is read and PLP_TI_START_ROW is the delay portion from which the first service frame data symbol of the new service frame is read.

Paragraph 28. A receiver according to paragraph 27, wherein a first of the plurality of delay portions of the sequence of the convolutional deinterleaver is arranged to delay the encoded data cells from the input to the output by the least amount compared to the other delay portions in the sequence, and a last of the delay portions in the sequence is arranged to delay the encoded data cells by the greatest amount, and the value A is calculated in accordance with $A = ((N_r - 1) - R_s) * (N_r - 1)$.

Paragraph 29. A receiver according to paragraph 27, a first of the plurality of delay portions of the sequence of the convolutional deinterleaver is arranged to delay the encoded data cells from the input to the output by the greatest amount compared to the other delay portions in the sequence, and a last of the delay portions in the sequence is arranged to delay the encoded data cells by the least amount, and the displacement value A is calculated in accordance with $A = R_s * (N_r + 1)$.

Paragraph 30. A receiver according to paragraph 28 or 29, wherein PLP_TI_FECFRAME_START and PLP_TI_START_ROW are received by the receiver as signalled data.

Paragraph 31. A receiver according to paragraph 28 or 29, wherein PLP_TI_FECFRAME_START and PLP_TI_START_ROW are received by the receiver as predetermined values.

Paragraph 32. A receiver according to any of paragraphs 23 to 31, wherein each of the delay portions includes one or more memory elements and the controller is configured to set the initial content of the memory elements of the deinterleaver before inputting the symbols of the received signal with predetermined values.

Paragraph 33. A receiver according to paragraph 32, wherein the predetermined values include symbols derived from a constant amplitude zero auto-correlation, CAZAC, sequence.

Paragraph 34. A receiver according claim 32 or 33, wherein the number of memory elements is $N_r \cdot (N_r - 1)/2$, where $N_r$ is the number of rows of the convolutional deinterleaver.

Paragraph 35. A method for recovering data symbols from a received signal, the method comprising detecting the received signal, the received signal comprising an interleaved stream of encoded data cells comprising a sequence of service frames, each service frame including one or more forward error correction encoded frames of encoded data cells, convolutional deinterleaving the stream of encoded data cells using a plurality of delay portions, decoding the encoded frames of encoded data cells, wherein the decoding the encoded frames comprises detecting a service frame, detecting from which of the delay portions a first service frame data symbol of the new service frame is read for the convolutional deinterleaving, detecting the number of the encoded data cells of the service frame after which a first forward error correction frame is read, detecting, based upon the detected service frame, the delay portion from which a first encoded data cell of the service frame is read, and the number of the encoded data cells of the service frame after which a first encoded data cell of one or more of the forward error correction frames is read, whether any encoded data cells of one or more of the forward error correction frames were transmitted in a previous service frame, and if any of the encoded data cells of one or more of the forward error correction frames were transmitted in a previous service frame, not decoding the forward error correction frame, or if no encoded data cells of the one or more of the forward error correction frames were transmitted in a previous service frame, decoding the forward error correction frame to recover the stream if data symbols.

Paragraph 36. A method according to paragraph 35, comprising switching to detect the received signal during the previous service frame.

Paragraph 37. A method according to paragraph 35 or 36, wherein the number of encoded data cells of the service frame after which a first encoded data cell of the first forward error correction frames of the service frame can be read in order for a first of the forward error correction frames to be decoded is greater than or equal to a displacement value A determined in accordance with the start row of the convolutional deinterleaver and the number of rows in the deinterleaver.

Paragraph 38. A method according to paragraph 37, wherein the convolutional deinterleaving comprises inputting the encoded data cells to the delay portions so that successive encoded data cells are input in accordance with the sequence of the delay portions, each of the delay portions being arranged to delay encoded data cells from an input to an output by a different amount, the delay portions being arranged in a sequence, and reading the symbols from the delay portions by successively selecting the encoded data cells from the outputs of the delay portions in accordance with the sequence of the delay portions to form a deinterleaved stream of encoded data cells.

Paragraph 39. A method according to paragraph 38, wherein the displacement value A is based on a multiplication of a factor $R_s$ by a number of delay portions $N_r$, where $$R_s = (PLP\_TI\_FECFRAME\_START + PLP\_TI\_START\_ROW)(\bmod N_r)$$

and where PLP_TI_FECFRAME_START is the number of service frame data cells of the new service frame after which the first data symbol of the first forward error correction frame is read and PLP_TI_START_ROW is the delay portion from which the first service frame data symbol of the new service frame is read.

Paragraph 40. A method according to paragraph 39, wherein a first of the plurality of delay portions of the sequence of the convolutional deinterleaver is arranged to delay the encoded data cells from the input to the output by the least amount compared to the other delay portions in the sequence, and a last of the delay portions in the sequence is arranged to delay the encoded data cells by the greatest amount, and the value A is calculated in accordance with $A = ((N_r - 1) - R_s) * (N_r - 1)$.

Paragraph 41. A method according to paragraph 35, a first of the plurality of delay portions of the sequence of the convolutional deinterleaver is arranged to delay the encoded data cells from the input to the output by the greatest amount compared to the other delay portions in the sequence, and a last of the delay portions in the sequence is arranged to delay the encoded data cells by the least amount, and the displacement value A is calculated in accordance with $= R_s * (N_r + 1)$.

Paragraph 42. A method according to paragraph 39, 40 or 41, the method comprising receiving PLP_TI_FECFRAME_START and PLP_TI_START_ROW by the receiver as signalled data.

Paragraph 43. A method according to paragraph 39, 40 or 41, the method comprising receiving PLP_TI_FECFRAME_START and PLP_TI_START_ROW by the receiver as predetermined values.

Paragraph 44. A method according to any of paragraphs 35 to 43, wherein each of the delay portions includes one or more memory elements and the method comprises setting the initial content of the memory elements of the deinterleaver before inputting the symbols of the received signal with predetermined values.

Paragraph 45. A method according to paragraph 44, wherein the predetermined values include symbols derived from a constant amplitude zero auto-correlation, CAZAC, sequence.

Paragraph 46. A method according to any of paragraphs 35 to 45, wherein the number of memory elements is $N_r \cdot (N_r - 1)/2$, where $N_r$ is the number of rows of the convolutional deinterleaver.

Paragraph 47. A computer program having computer executable instructions, which when loaded on to a computer causes the computer to perform the method according to any of paragraphs 12 to 22 and 35 to 47.

Various further aspects and features of the present disclosure are defined in the appended claims. Various combinations of features may be made of the features and method steps defined in the dependent claims other than the specific combinations set out in the attached claim dependency. Thus the claim dependencies should not be taken as limiting.

The invention claimed is:

1. A receiver for recovering data symbols from a received signal, the receiver comprising:
   a demodulator configured to detect the received signal, which includes a convolutionally interleaved symbol stream including a sequence of service frames, each service frame including one or more forward-error-correction encoded frames of encoded data cells;
   convolutional deinterleaver circuitry including a plurality of delay portions and configured to convolutionally deinterleave the received encoded data cells;
   a forward-error-correction decoder configured to decode the encoded frames of encoded data cells; and
   controller circuitry configured to
     detect a service frame, and from the detected service frame, detect first signaling data representing a delay portion of a convolutional interleaver into which a first encoded data cell has been input, and second signaling data representing a number of service-frame-encoded data cells by which a first encoded data cell of a first complete forward-error-correction frame is delayed from input to output of the convolutional interleaver, and
     set a commutator of the convolutional deinterleaver circuitry according to the first signalling data, and deinterleave a first error-correction frame from the service frame using the second signalling data, the first error-correction frame being a complete error correction frame.

2. The receiver as claimed in claim 1, wherein the controller circuitry is further configured to write a first encoded data cell of a service frame into a delay portion of the convolutional deinterleaver circuitry identified by the first signalling data.

3. The receiver as claimed in claim 1, wherein the controller circuitry is further configured to detect the service frame, which is an ASTC subframe.

4. The receiver as claimed in claim 1, wherein the first error-correction frame is encoded data of one Physical Layer Pipe.

5. The receiver as claimed in claim 1, wherein the receiver is further configured, when initially acquiring the received signal, not to deinterleave encoded data cells of a forward-error-correction frame from the convolutional deinterleaver circuitry representing a forward-error-correction frame of a Physical Layer Pipe prior to the first complete forward-error-correction frame of the service frame detected by the controller circuitry.

6. The receiver as claimed in claim 5, wherein receiver is further configured to use the second signalling data to identify the first complete forward-error-correction frame.

7. The receiver as claimed in claim 5, wherein the receiver is configured to use the second signaling data to ensure that the convolutional deinterleaver does not deinterleave a forward-error-correction frame of a current service frame that has encoded data cells in a previous service frame.

8. The receiver as claimed in claim 6, wherein the service frame is an ATSC subframe.

9. The receiver as claimed in claim 1, wherein each of the plurality of delay portions of the convolutional deinterleaver is arranged to delay symbols from the symbol stream from an input to an output by a different amount, the delay portions being arranged in a sequence, and the convolutional deinterleaver further includes an input commutator configured to input the encoded data cells to the delay portions so that successive encoded data cells are input in accordance with the sequence of the delay portions, and an output commutator configured to read the symbols from the delay portions by successively selecting the encoded data cells from the outputs of the delay portions in accordance with the sequence of the delay portions to form a deinterleaved stream of encoded data cells from the received interleaved stream of encoded data cells.

10. The receiver as claimed in claim 1, wherein each of the delay portions includes one or more memory elements, and the controller circuitry is further configured to set an initial content of the one or more memory elements of before inputting the symbols of the received signal with values known to the receiver.

11. The receiver as claimed in claim 10, wherein the values known to the receiver are dummy values.

12. The receiver as claimed in claim 9, wherein the values known to the receiver are an algorithmically calculatable sequence of values.

13. The receiver as claimed in claim 1, wherein the one or more forward-error-correction encoded frames are in the form of one or more pluralities of constellation-mapped cells.

14. The receiver as claimed in claim 1, wherein the second signaling data is an ATSC L1-Detail field for a physical layer pipe.

15. The receiver as claimed in claim 1, wherein the first signalling data is an ATSC L1-Detail CTI_Start_Row field for a physical layer pipe.

16. A method for recovering data symbols from a received signal, the method comprising:

detecting the received signal, the received signal including a convolutionally interleaved symbol stream including a sequence of service frames, each service frame including one or more forward-error-correction encoded frames of encoded data cells, convolutionally deinterleaving the received encoded data cells, decoding the encoded frames of encoded data cells, detecting a service frame, and from the detected service frame, detecting first signaling data representing a delay portion of a convolutional interleaver into which a first encoded data cell has been input, and second signaling data representing a number of service-frame-encoded data cells by which a first encoded data cell of a first complete forward-error-correction frame is delayed from input to output of a convolutional interleaver, and performing control according to the first signalling data and deinterleaving a first error-correction frame from the service frame using the second signalling data, the first error-correction frame being a complete error-correction frame.

17. The method as claimed in claim 16, wherein the controlling step includes when acquiring the received signal, not deinterleaving encoded data cells of a forward-error-correction frame representing a forward error correction frame of a Physical Layer Pipe prior to the first complete forward-error-correction frame of a service frame.

18. The method as claimed in claim 16, wherein the one or more forward error-correction encoded frames are in the form of one or more pluralities of constellation-mapped cells.

19. The method as claimed in claim 16, wherein the detected service frame is an ASTC subframe.

20. A non-transitory computer readable medium including computer program instructions, which when executed by a computer causes the computer to perform the method of claim 16.

* * * * *